United States Patent
Komoike

[19]

[11] Patent Number: 6,094,736
[45] Date of Patent: Jul. 25, 2000

[54] SEMICONDUCTOR INTEGRATED CIRCUIT DEVICE

[75] Inventor: Tatsunori Komoike, Tokyo, Japan

[73] Assignee: Mitsubishi Denki Kabushiki Kaisha, Tokyo, Japan

[21] Appl. No.: 09/044,238

[22] Filed: Mar. 19, 1998

[30] Foreign Application Priority Data

Nov. 20, 1997 [JP] Japan .................................... 9-319677

[51] Int. Cl.[7] .................................................. G01R 31/28
[52] U.S. Cl. ............................................ 714/726; 714/724
[58] Field of Search ...................... 714/726, 724, 714/728

[56] References Cited

U.S. PATENT DOCUMENTS 5,848,075  12/1998  Katayama et al. ..................... 714/726
5,903,579   5/1999  Osawa et al. .......................... 714/726
5,905,737   5/1999  Osawa et al. .......................... 714/726

FOREIGN PATENT DOCUMENTS 62-35644  2/1987  Japan .
7-128406  5/1995  Japan .

*Primary Examiner*—Phung M. Chung
*Attorney, Agent, or Firm*—Burns, Doane, Swecker & Mathis, LLP

[57] ABSTRACT

A semiconductor integrated circuit device having a CPU or a logic circuit 4, a DRAM 2, and a plurality of selectors 8 mounted on a semiconductor chip. The selectors 8 are formed on a wiring 5 including a plurality of lines through which the CPU or the logic circuit 4 is connected to the DRAM 2. According to a control signal received through a wiring 6, a wiring 7 for transferring test patterns is connected to the DRAM 2, or the CPU or the logic circuit 4 is connected to the DRAM 2.

12 Claims, 16 Drawing Sheets

INPUTS FOR TEST  OUTPUTS FOR TEST

SEMICONDUCTOR INTEGRATED CIRCUIT DEVICE

BACKGROUND OF THE INVENTION

1. Field of the Invention

The present invention relates to a semiconductor integrated circuit device in which a central processing unit or a logic circuit and a dynamic random access memory are mounted on a same semiconductor chip.

2. Description of the Prior Art

FIG. 21 is a block diagram showing a configuration of a conventional semiconductor integrated circuit device having a dynamic random access memory (DRAM). In FIG. 21, the reference number 1 designates a semiconductor chip, 2 denotes the DRAM mounted on the semiconductor chip 1, and 3 indicates a wiring having a plurality of lines through which test patterns for the DRAM are transferred from an external device (omitted from FIG. 21) to the DRAM 2.

FIG. 22 is a block diagram showing a configuration of a conventional hybrid type semiconductor integrated circuit device in which a central processing unit (CPU) or a logic circuit and a DRAM are mounted on a same semiconductor chip. In FIG. 22, the reference number 4 designates a CPU or a logic circuit, 2 denotes a DRAM, and 5 indicates a wiring having a plurality of lines through which the CPU or the logic circuit 4 is electrically connected to the DRAM 2.

Next, a description will be given of the operation of the semiconductor integrated circuit device.

In the configuration of the conventional semiconductor integrated circuit device in which only the DRAM is mounted on the semiconductor chip 1, as shown in FIG. 21, when the test of the operation of the DRAM 2 is performed, test patterns provided from an external device are received through input terminals for test, and the received test patterns are then transferred to the DRAM 2 through the wiring 3.

After the completion of the test, the test patterns as test results are transferred from the DRAM 2 to the external device (omitted from FIG. 21) through the wiring 3 and output terminal for test. After this, the test patterns as the test result are compared with the original test patterns in order to check whether the DRAM 2 performs correctly or not.

FIG. 22 shows the configuration of the conventional semiconductor integrated circuit device of the hybrid type in which both the CPU or the logic circuit 4 and the DRAM 2 are mounted on the same semiconductor chip 1. This hybrid type semiconductor integrated circuit device is becoming one of the leading mainstreams of large scale hybrid integrated semiconductor circuit devices. By using this configuration of the semiconductor integrated circuit device shown in FIG. 22, because through the wiring 5 the CPU or the logic circuit 4 is directly connected to the DRAM 2, it is possible to avoid drawbacks such as occurrence of noise and signal transmission delay and increasing of a power consumption by an interface between a chip of the CPU or the logic circuit 4 and a chip of the DRAM 2 in other conventional semiconductor integrated circuit device.

However, in the configuration of the semiconductor integrated circuit device shown in FIG. 22, because the wiring 5 is formed between the CPU or the logic circuit 4 and the DRAM 2 to directly connect both them, because test patterns are not directly transferred from an external device to each of the CPU, or logic circuit 4 and the DRAM 2 directly, so that it is difficult to perform the test operation for each of them.

The outline of the discussion about the drawbacks of the conventional hybrid type semiconductor integrated circuit device is as follows:

Since the conventional semiconductor integrated circuit device has the configuration described above, because the wiring 5 is formed between the CPU or the logic circuit 4 and the DRAM 2 in the same semiconductor chip 1 in order to directly connect both them, so that test patterns are not directly transferred from an external device (not shown) to each of the CPU, or logic circuit 4 and the DRAM 2 and it is therefore difficult to perform the test operation for each of them.

SUMMARY OF THE INVENTION

Accordingly, an object of the present invention is, with due consideration to the drawbacks of the conventional semiconductor integrated circuit device, to provide a hybrid type semiconductor integrated circuit device, in which a CPU or a logic circuit and a DRAM are mounted on a same semiconductor chip, capable of performing the test operation for the DRAM, or for the CPU or the logic circuit easily and efficiently.

In accordance with a preferred embodiment according to the present invention, a semiconductor integrated circuit device comprises a central processing unit (CPU) or a logic circuit formed on a semiconductor chip, a dynamic random access memory (DRAM) mounted on said same semiconductor chip, a first wiring having a plurality of lines through which said CPU or said logic circuit is electrically connected to said DRAM, a second wiring through which a control signal is inputted, a third wiring having one or more lines through which test pattern data items are inputted and output, and a plurality of switch circuits for switching a connection between said CPU or said logic circuit through said first wiring to/from a connection between said DRAM and said third wiring through said first wiring according to said control signal received through said second wiring.

The semiconductor integrated circuit as another preferred embodiment according to the present invention further comprises scan pass circuits formed on said plurality of lines in said first wiring for converting serial test pattern data items transferred through said third wiring to parallel test pattern data items, for outputting said converted parallel test pattern data items to said DRAM through said first wiring, further for converting parallel test pattern data items as test result transferred from said DRAM through said first wiring to serial test pattern data items, and for outputting said serial test pattern data items as the test result to said third wiring.

In accordance with another preferred embodiment according to the present invention, a semiconductor integrated circuit device comprises a central processing unit (CPU) or a logic circuit formed on a semiconductor chip, a dynamic random access memory (DRAM) mounted on said same semiconductor chip, a first wiring having a plurality of lines through which said CPU or said logic circuit is electrically connected to said DRAM, a second wiring through which a control signal is inputted, a third wiring having one or more lines through which test pattern data items are inputted and output, and a plurality of switch circuits, formed in at least one of said CPU or said logic circuit and said DRAM, for switching a connection between a fourth wiring having one or more lines that being used during a normal operation other than a test operation and said first wiring to/from a connection between said third wiring and said first wiring according to said control signal received through said second wiring.

In the semiconductor integrated circuit device as another preferred embodiment according to the present invention, when a test pattern data item to be transferred through said fourth wiring to said first wiring may be predicted in advance, said fourth wiring is electrically connected to said corresponding line in said first wiring directly.

In accordance with another preferred embodiment according to the present invention, a semiconductor integrated circuit device comprises a central processing unit (CPU) or a logic circuit formed on a semiconductor chip, a dynamic random access memory (DRAM) mounted on said same semiconductor chip, a first wiring having a plurality of lines through which said CPU or said logic circuit is electrically connected to said DRAM, a second wiring through which a control signal is inputted, a third wiring having one or more lines through which test pattern data items are inputted and output, and scan pass circuits, formed on at least one of said CPU or said logic circuit and said DRAM, for halting a connection between a fourth wiring having one or more lines that being used during a normal operation other than a test operation and said first wiring, for converting serial test pattern data items inputted through said third wiring to parallel test pattern data items, for outputting said converted parallel test pattern data items to said first wiring, further for converting parallel test pattern data items as a test result transferred from said DRAM through said first wiring to serial test pattern data items, and for outputting said serial test pattern data items that have been converted as the test result to said third wiring, according to said control signal received through said second wiring.

In the semiconductor integrated circuit device as another preferred embodiment according to the present invention, in said scan pass circuits, a scan flip flop is formed at a node to electrically disconnect said fourth wiring from said first wiring according to said control signal inputted through said second wiring, and a flip flop is formed at a node at which a signal value to be transferred from said line in said fourth wiring to said line in said first wiring is predicted in advance.

In accordance with another preferred embodiment according to the present invention, a semiconductor integrated circuit device comprises a central processing unit (CPU) or a logic circuit formed on a semiconductor chip, a dynamic random access memory (DRAM) mounted on said same semiconductor chip, a first wiring having a plurality of lines through which said CPU or said logic circuit is electrically connected to said DRAM, a second wiring through which a control signal is inputted, a third wiring having one or more lines through which test pattern data items are inputted and output, a plurality of switch circuits, formed in at least one of said CPU or said logic circuit and said DRAM, for switching a connection between a fourth wiring having one or more lines that being used during a normal operation other than a test operation and said first wiring to/from a connection between said third wiring and said first wiring, according to said control signal received through said second wiring, and a plurality of scan pass circuits formed in said CPU or said logic circuit and said DRAM in which said plurality of switch circuits are formed, for halting a connection between said fourth wiring and said first wiring on which no switch circuit is formed, for converting serial test pattern data items inputted through said third wiring to parallel test pattern data items, for outputting said converted parallel test pattern data items to said first wiring, further for converting parallel test pattern data items as a test result transferred from said DRAM through said first wiring to serial test pattern data items, and for outputting said serial test pattern data items that have been converted as the test result to said third wiring, according to said control signal received through said second wiring.

In the semiconductor integrated circuit device as another preferred embodiment according to the present invention, said plurality of switch circuits or said plurality of scan pass circuits output test pattern data items as said test result from said DRAM connected to said fist wiring after said CPU or said logic circuit outputs said test pattern data items to said first wiring, and said plurality of switch circuits or said plurality of scan pass circuits output said test pattern data items as a test result from said CPU or said logic circuit when said test pattern data items are output from said DRAM to said first wiring.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of the semiconductor integrated circuit device according to the present invention will now be described with reference to the drawings.

First Embodiment

Figure 1:
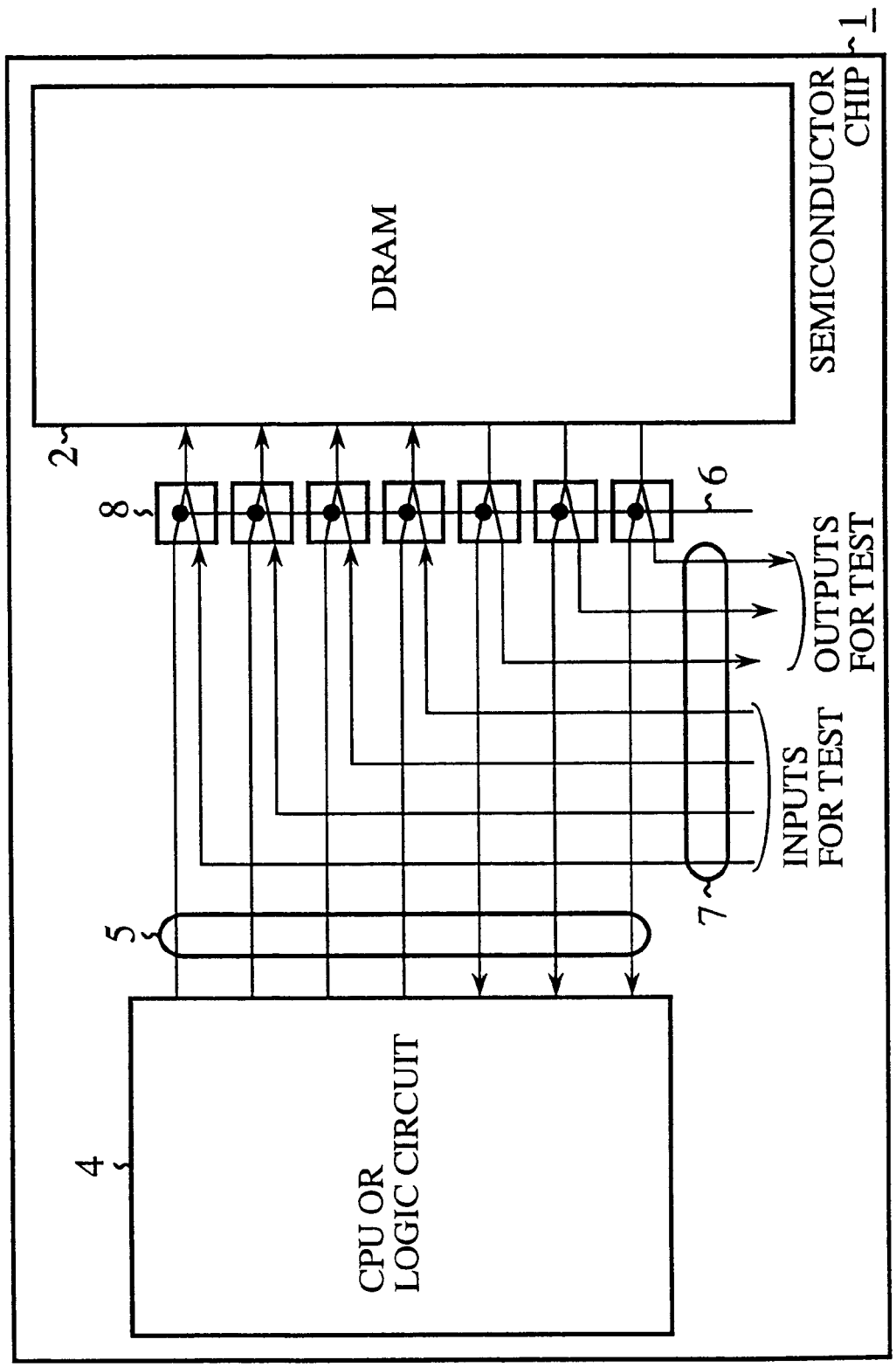
FIG. 1 is a block diagram showing a configuration of a semiconductor integrated circuit device of a hybrid type in which a CPU or a logic circuit and a DRAM are mounted on a same semiconductor chip as the first embodiment according to the present invention.
Figure 22:
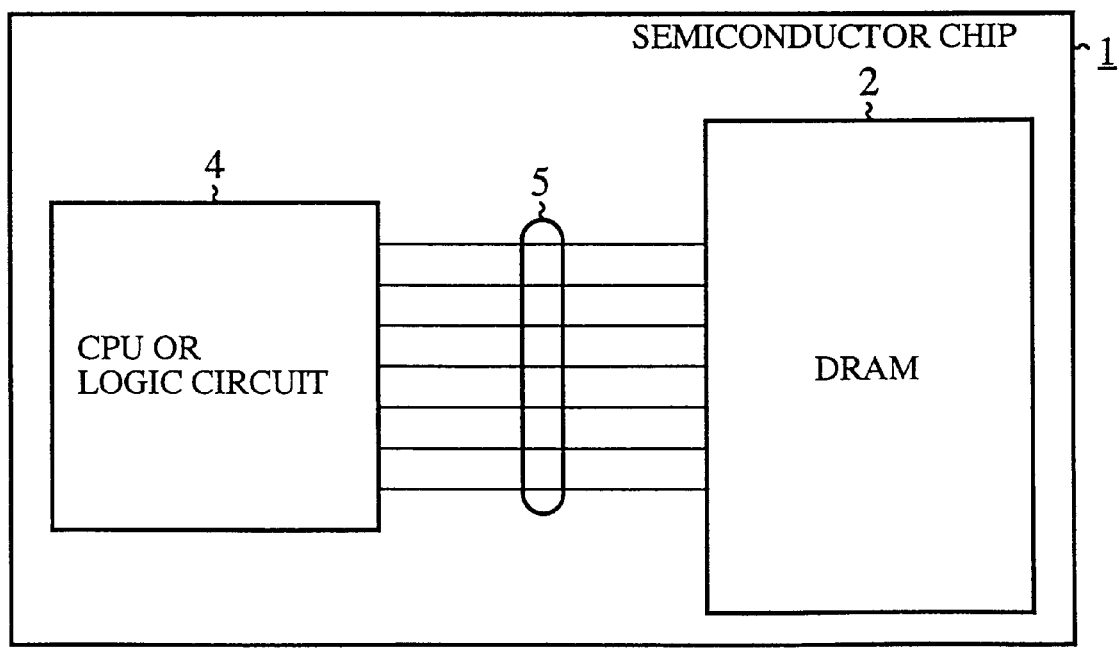
FIG. 22 is a block diagram showing a configuration of a conventional semiconductor integrated circuit device of a hybrid type in which a CPU or a logic circuit and a DRAM are mounted on a same semiconductor chip.

FIG. 1 is a block diagram showing a configuration of the semiconductor integrated circuit device of a hybrid type in which a central processing unit (CPU) or a logic circuit and a dynamic random access memory (DRAM) are mounted on a same semiconductor chip as the first embodiment according to the present invention. In FIG. 1, the reference number designates a semiconductor chip, 2 denotes a DRAM mounted on the same semiconductor chip 1. The reference number 4 indicates a CPU or a logic circuit mounted on the same semiconductor chip. The reference number 5 designates a wiring group (a first wiring) having a plurality of lines. These circuit elements described above are the same as the circuit elements in the conventional semiconductor integrated circuit device shown in FIG. 22.

The reference number 6 designates a wiring (a second wiring) through which a control signal transferred from an external device (omitted from the drawings) of the semiconductor chip 1 is received. The reference number 7 denotes a wiring group (a third wiring) including a plurality of lines through which test patterns transferred from an external device of the semiconductor chip 1 are received. The reference number 8 designates a selector group (a switch circuit) comprising a plurality of selectors, whose number corresponds to the number of the lines forming the wiring group 5 and the number of the lines forming the wiring 7. The operation of each of the selectors in the selector group 8 is controlled by a control signal transferred from an external device (omitted from the diagrams) through the wiring 6.

Figure 2:
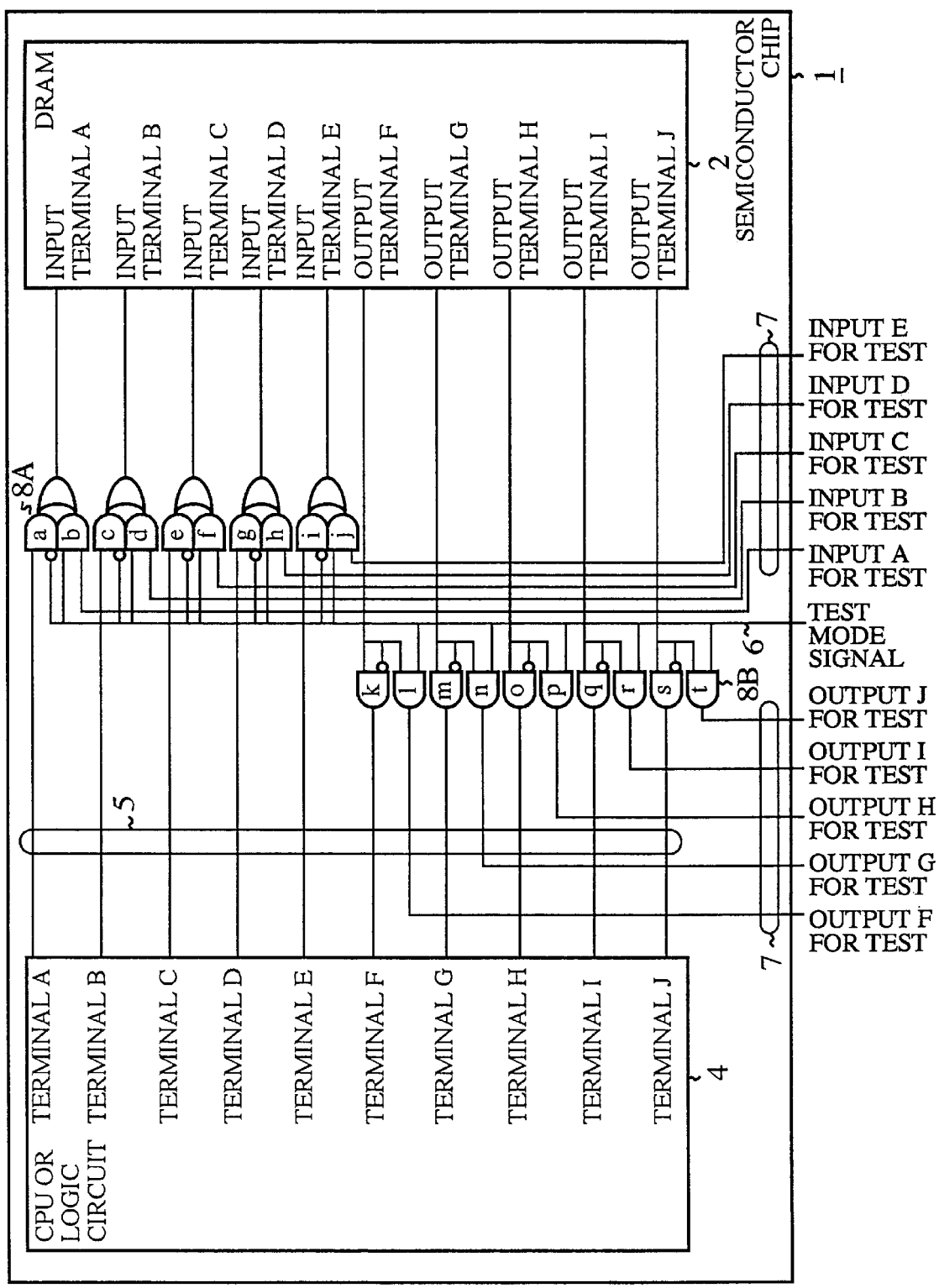
FIG. 2 is a block diagram showing a detailed configuration of the semiconductor integrated circuit device shown in FIG. 1.

FIG. 2 is a block diagram showing a detailed configuration of the semiconductor integrated circuit device shown in FIG. 1. In FIG. 2, the reference character 8A designates a selector (a switch circuit) comprising two AND gates (each pair of a and b, c and d, e and f, g and h, and i and j) and an OR gate, and 8B designates a selector (a switch circuit) comprising two AND gates (each pair of k and 1, m and n, o and p, q and r, and s and t). The selector group 8 comprises a plurality of the selectors, namely each selector is made up of the circuit elements 8A and 8B.

Next, a description will be given of the operation of the semiconductor integrated circuit device of the first embodiment.

Because both FIGS. 1 and 2 show the semiconductor integrated circuit device having the same function, the operation of the semiconductor integrated circuit device of the first embodiment will be explained mainly referring FIG. 2.

First, when the test operation of the DRAM 2 is performed, the level of a test mode signal (as a control signal) is set to a high (H) level so that the AND gates a, c, e, g, i, k, m, o, q, and s enter an inactive state, and the AND gates b, d, f, h, j, l, n, p, r, and t enter an active state. Thereby, this state halts the signal transfer/receiving operation in a normal process from the terminals A to E in the CPU or the logic circuit 4 to the input terminals A to E in the DRAM 2, and the signal transfer/receiving operation in the normal process from the output terminals F to J in the DRAM 2 to the terminals F to J in the CPU or the logic circuit 4. On the other hand, this state permits to electrically connect the input terminals A to E for test operation with the input terminals A to E in the DRAM 2 through the wiring group 7 and also to electrically connect the output terminals F to J with the output terminals for test operation with the wiring group 7.

Next, the semiconductor integrated circuit device inputs test patterns provided form an external device (omitted from the drawings) through the input terminals A to E for test operation. Then, the test patterns are transferred to the DRAM 2 through the input terminals A to E and stored in the DRAM 2. Following this, test patterns are read from the DRAM 2 as a test result and are transferred to the external device from the output terminals F to J in the DRAM 2 through the wiring group 7. The original test patterns are compared with the test patterns as the test result in order to detect whether or not the DRAM 2 has any fault.

After this, the test mode signal is set to a low (L) level so that the signal transfer/receiving operation in the normal process may be performed from the terminals A to E in the CPU or the logic circuit 4 to the input terminals A to E in the DRAM 2, and the signal transfer/receiving operation in the normal process may also be performed from the output terminals F to J in the DRAM 2 to the terminals F to J in the CPU or the logic circuit 4. On the other hand, the input terminals A to E for the test operation are electrically disconnected from the input terminals A to E in the DRAM 2 and the output terminals F to J for the test operation are electrically disconnected from the output terminals F to G in the DRAM 2 through the wiring group 7.

Although the control signals such as the test mode signal and the like and the test patterns are provided from the external device to the DRAM 2 in the configuration of the semiconductor integrated circuit device of the first embodiment, it is acceptable to receive the control signals and the test patterns provided from other node in the semiconductor integrated circuit device formed on the same semiconductor chip 1 and it is also acceptable to output the test patterns as the test result from the DRAM 2 to other node in the semiconductor integrated circuit device formed on the same semiconductor chip 1 in order to compare them.

As described above in detail, according to the semiconductor integrated circuit device of a hybrid type as the first embodiment according to the present invention in which the CPU or the logic circuit and the DRAM are formed on the same semiconductor chip, it is possible to provide test patterns to the DRAM 2 by switching the selectors in the selector group 8 and to perform the operation test of the DRAM 2.

Second Embodiment

Figure 3:
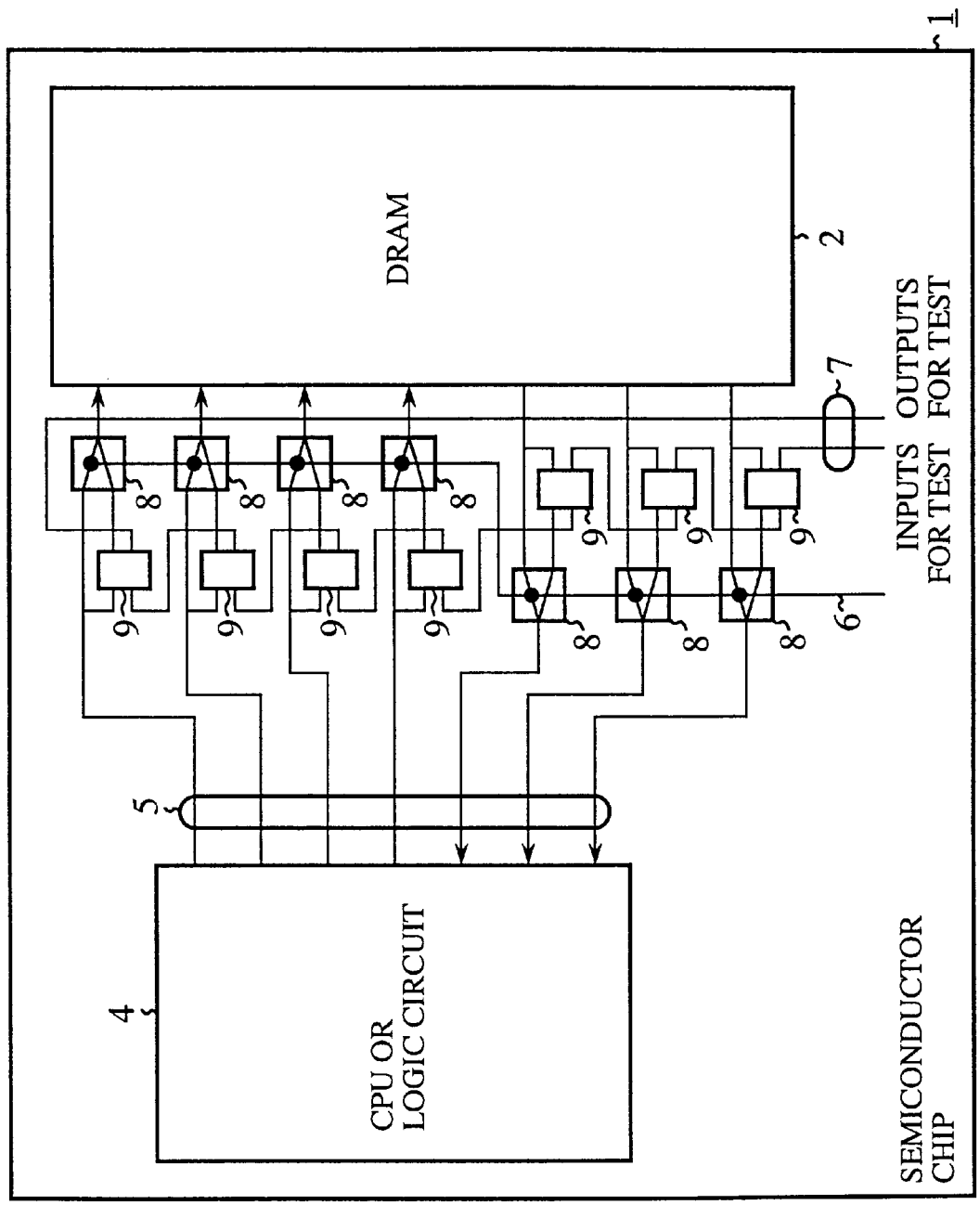
FIG. 3 is a block diagram showing a configuration of a semiconductor integrated circuit device of a hybrid type in which a CPU or a logic circuit and a DRAM are mounted on a same semiconductor chip as the second embodiment according to the present invention.

FIG. 3 is a block diagram showing a configuration of the semiconductor integrated circuit device of a hybrid type in which the CPU or the logic circuit and the DRAM are mounted on the same semiconductor chip as the second embodiment according to the present invention. In FIG. 3, the reference number 7 designates a wiring group having two lines for inputting test patterns and outputting test patterns as a test result of the DRAM 2. The reference number 9 denotes scan flip flops (as a scan pass circuit) for converting serial test patterns transferred through the line in the wiring group 7 and for providing converted parallel test patterns to the DRAM 2, and for converting parallel test patterns as a test result from the DRAM 2 to serial test patterns and for outputting the converted serial test patterns to the line in the wiring group 7.

Figure 4:
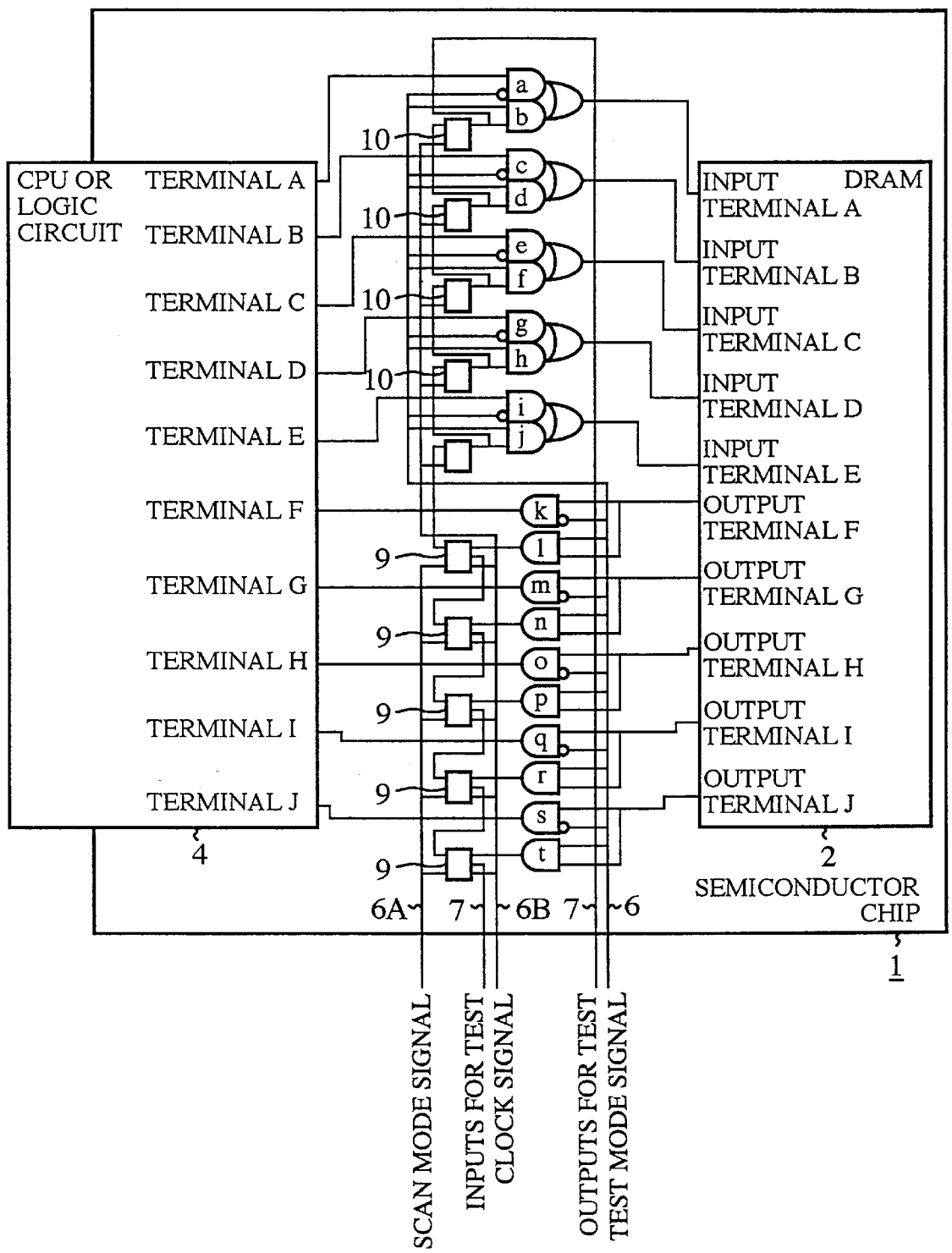
FIG. 4 is a block diagram showing another configuration of the semiconductor integrated circuit device shown in FIG. 3.

FIG. 4 is a block diagram showing another configuration of the semiconductor integrated circuit device shown in FIG. 3. In FIG. 4, the reference character 6A designates a scan mode signal (as a control signal), and 6B indicates a clock signal (as a control signal). The reference number 10 denotes a flip flop (as a scan pass circuit). In the configuration shown in FIG. 4, five flip flops 10 for input of the test data items are formed.

Figure 5A:
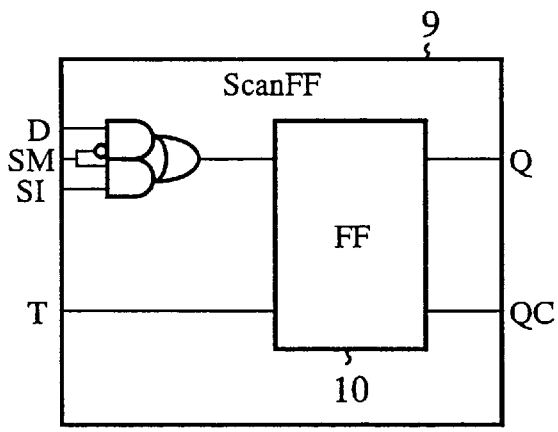
FIGS. 5A to 5F are diagrams showing the operation of scan pass circuits incorporated in the semiconductor integrated circuit device shown in FIG. 4.
Figure 5B:
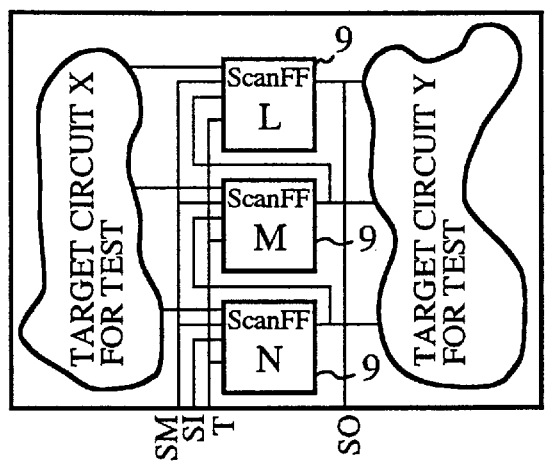

FIGS. 5A to 5F are diagrams showing the operation of the scan pass circuits incorporated in the semiconductor integrated circuit device shown in FIG. 4. In FIG. 5A, the reference number 10 designates the flip flop (as the scan pass circuit) incorporated in the scan flip flop circuit 9. Because other components in the semiconductor integrated circuit as the second embodiment are the same as those in the semiconductor integrated circuit device as the first embodiment, the same reference numbers are used, and therefore the explanation of them is omitted here for brevity.

Next, a description will be given of the operation of the semiconductor integrated circuit device of the second embodiment.

First, the basic operation of the scan pass circuit 9 incorporated in the semiconductor integrated circuit device of the second embodiment will be explained.

FIG. 5A shows the configuration of the scan flip flop 9 as the scan pass circuit. In the scan flip flop comprises a flip flop 10. When a scan mode signal SM as a control signal is in the L level, a data signal D is transferred to the flip flop 10 in the scan flip flop 9. Furthermore, when the scan mode signal SM is in the H level, a scan data signal SI is transferred to the flip flop 10 in the scan flip flop 9. The flip flop 10 receives and stores those signals D and SI according to receiving a clock signal T. The flip flop 10 outputs the stored signals D and SI as output signals Q and QC according to the clock signal T.

Figure 5C:
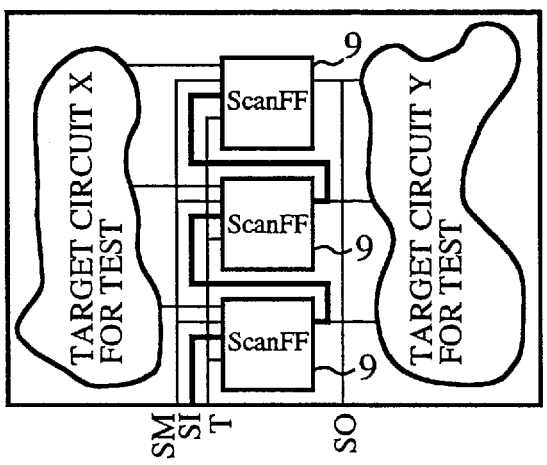
Figure 5D:
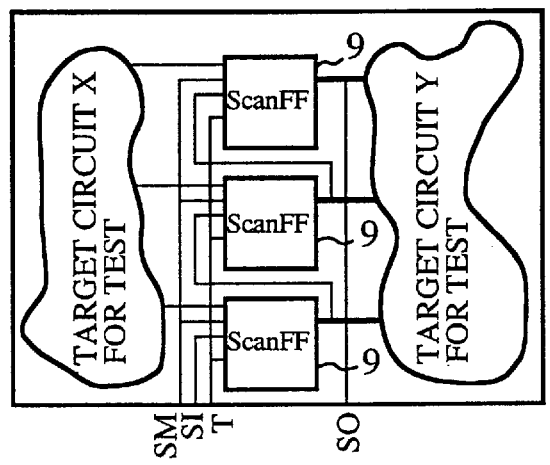

For example, as shown in FIG. 5C, test data input and output operation will be explained when three scan flip flops (L, M, and N) 9 are connected to the target test circuits X and Y.

As shown in FIG. 5C, the scan mode signal SM is set to the H level, and the scan flip flops (L, M, and N) 9 receive serial test data items as the scan data signal SI. By receiving the several clock signals, the test data items are transferred to the scan flip flops (L, M, and N) 9 through the lines designated by the solid lines shown in FIG. 5C. After the scan flip flop (L) 9 as the upper most position in FIG. 5C receives the test data item, when receiving a following clock signal, the scan flip flops (L, M, and N) 9 output the parallel test data items to the target test circuit Y, as shown in FIG. 5F.

Figure 5E:
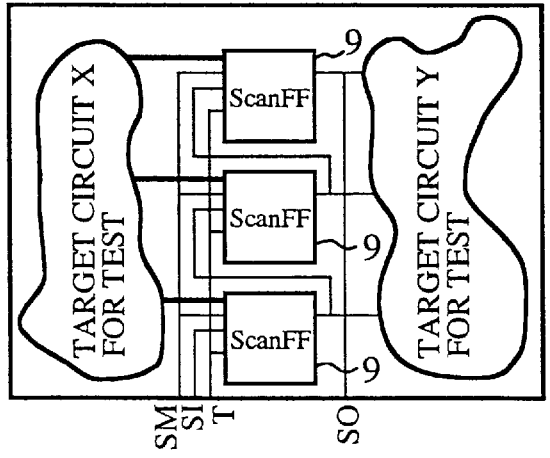

Next, as shown in FIG. 5E, the scan mode signal SM is set to the L level, and parallel output data items to be used for the target test circuit X are then transferred from the flip flops (L, M, and N) 9 onto the pass designated by the solid line according to the clock signal.

Figure 5F:
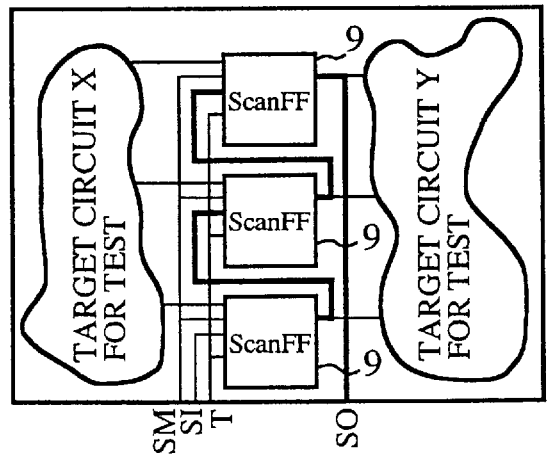

Next, as shown in FIG. 5F, when the scan mode signal SM is set to the H level, the output data items from the target test circuit X are transferred to the flip flops (L, M, and N) 9 in order through the pass designated by the solid lines. Thereby, serial scan output (SO) data items as the test result are transferred to an external device (omitted from the drawings) through the terminal for the scan output SO.

FIG. 3 shows the configuration in which the scan flip flops 9 are formed corresponding to the selectors 8.

When the test operation of the DRAM 2 is executed, the test mode signal to be transferred to the wiring 6 is set to the H level. Thereby, the selectors 8 selects the scan flip flops 9.

That is, the scan flip flops 9 enter the active state and the wiring group 7 is electrically connected to the input terminals and the output terminals of the DRAM 2.

Next, when the serial test patterns are transferred to the scan flip flops 9 and when the scan flip flop 9 of the upper most position shown in FIG. 3 receives this serial test pattern, the parallel test pattern data items are transferred from the upper four scan flip flops 9 to the DRAM 2. Then, the DRAM 2 stores the parallel test patterns from the upper four scan flip flops 9 according to the following clock signal. After this, the lower three scan flip flops 9 read the parallel test pattern data items from the DRAM 2 according to the clock signal and convert them into the serial test pattern data items. Then, the converted serial test pattern data items are transferred to the external device through the line in the wiring group 7 according to the plurality of the clock signals.

In the configuration shown in FIG. 4, the flip flops 10 are used for the input of the test patterns, that are provided to the DRAM 2, instead of the scan flip flops 9 used in the configuration shown in FIG. 3. Because the test pattern data items must be read from the DRAM 2 simultaneously during the test pattern readout operation, it is required to read the test pattern data items through the terminal of the data D of each scan flip flop 9 by switching the level of the scan mode signal, as shown in FIG. 5A according to the scan data SI. Therefore, the scan flip flops must be used for the test pattern data readout operation. On the contrary, it is not necessary to use the scan flip flops 9 during the data writing operation to the DRAM 2 because it is not required to switch the scan mode signal. Therefore the flip flops 10 are used instead of the scan flip flops 9 for the data writing operation to the DRAM 2.

As described above, according to the semiconductor integrated circuit device as the second embodiment of the present invention, because the scan flip flops 9 or the flip flops 10 scan test pattern data items during the test data writing operation to the DRAM 2 and the test data readout operation from the DRAM 2. That is, the scan flip flops 9 or the flip flops 10 convert the test data items, and then write the converted test data items to the DRAM 2 during the test data writing operation, and the scan flip flops 9 read the parallel test pattern data items from the DRAM 2, convert the test data items to the serial test pattern data items, and then may output them to the external device by scanning them. Thereby, it is possible to decrease the number of lines in the wiring group 7 and possible to reduce the wiring area.

Further, in addition to the effect described above, because the flip flops 10 are used instead of the scan flip flops 9 in the configuration shown in FIG. 4, that are used to write test pattern data items to the DRAM 2, it is thereby possible to further reduce the circuit area of the semiconductor integrated circuit device when comparing the circuit area in the configuration shown in FIG. 3. This reduced circuit area may be used for other purposes efficiently.

Third Embodiment

Figure 6:
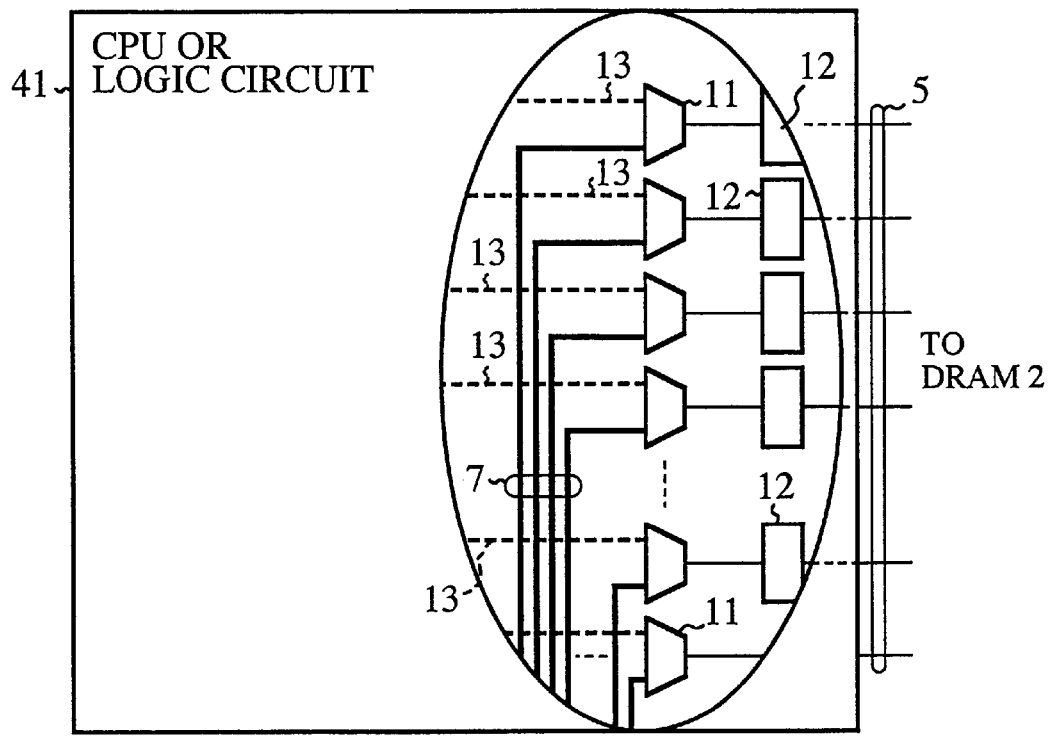
FIG. 6 is a block diagram showing a configuration of a semiconductor integrated circuit device of a hybrid type in which a CPU or a logic circuit and a DRAM are mounted on a same semiconductor chip as the third embodiment according to the present invention.

FIG. 6 is a block diagram showing the configuration of the semiconductor integrated circuit device of a hybrid type in which the CPU or the logic circuit and the DRAM are mounted on the same semiconductor chip as the third embodiment according to the present invention. In FIG. 6, the reference number 41 designates a CPU or a logic circuit, 11 denotes selectors formed in the CPU or the logic circuit 11 by an optimum design. The selectors 11 switches a wiring group 13 (as a fourth wiring) used during the normal operation mode other than the test operation mode from the wiring group 7 through which test pattern data items are transferred during the test operation mode. The reference number 12 designates flip flops (as scan pass circuits) to be used as an interface of the CPU or the logic circuit 41 connected to those selectors 11. Thus, FIG. 6 mainly shows the configuration of the CPU or the logic circuit 41 in the semiconductor integrated circuit device of the third embodiment.

Figure 7:
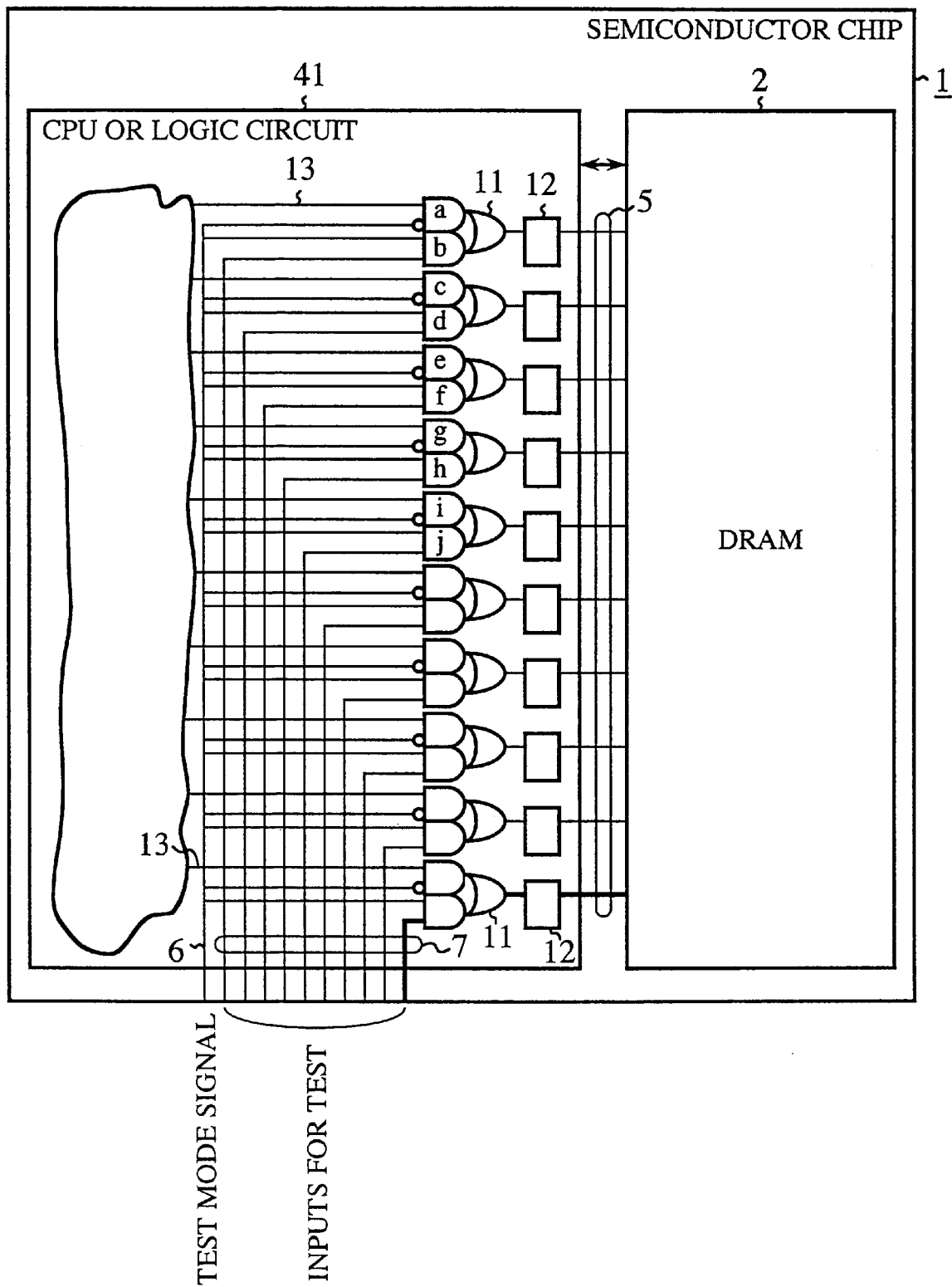
FIG. 7 is a block diagram showing a detailed configuration of the semiconductor integrated circuit device shown in FIG. 6.

FIG. 7 is a block diagram showing the detailed configuration of the semiconductor integrated circuit device of the third embodiment shown in FIG. 6. Because other components in the semiconductor integrated circuit as the third embodiment are the same as those in the semiconductor integrated circuit device as the first embodiment, the same reference numbers are used, and therefore the explanation of them is omitted here for brevity.

Next, a description will be given of the operation of the semiconductor integrated circuit device of the third embodiment.

Because both configurations shown in FIGS. 6 and 7 show the same function of the semiconductor integrated circuit device of the third embodiment, hereinafter the operation of the configuration shown in FIG. 7 will be mainly explained.

When the test operation for the DRAM 2 is performed, the test mode signal is set to the H level, so that the selectors 11 electrically disconnect the lines in the wiring group 13 used for the normal operation from the flip flops 12, and electrically connect the lines in the wiring group 7 used for the test operation to the flip flops 12.

Next, test pattern data items are received through the terminals for test input and then provided to the flip flops 12 through the selectors 11 according to the clock signal. In addition to this operation, according to following clock signals, the test patterns are transferred to the DRAM 2 through the lines in the wiring group 5 and then written into the DRAM 2.

Although the above description shows only the case in which the test pattern data items are written into the DRAM 2 from the CPU or the logic circuit 41, the test pattern data items are transferred from the DRAM 2 to the CPU or the logic circuit 41 after the completion of the test pattern writing process, and then provided to an external device (not shown in both FIGS. 6 and 7) through the lines in the wiring group 7.

Figure 8:
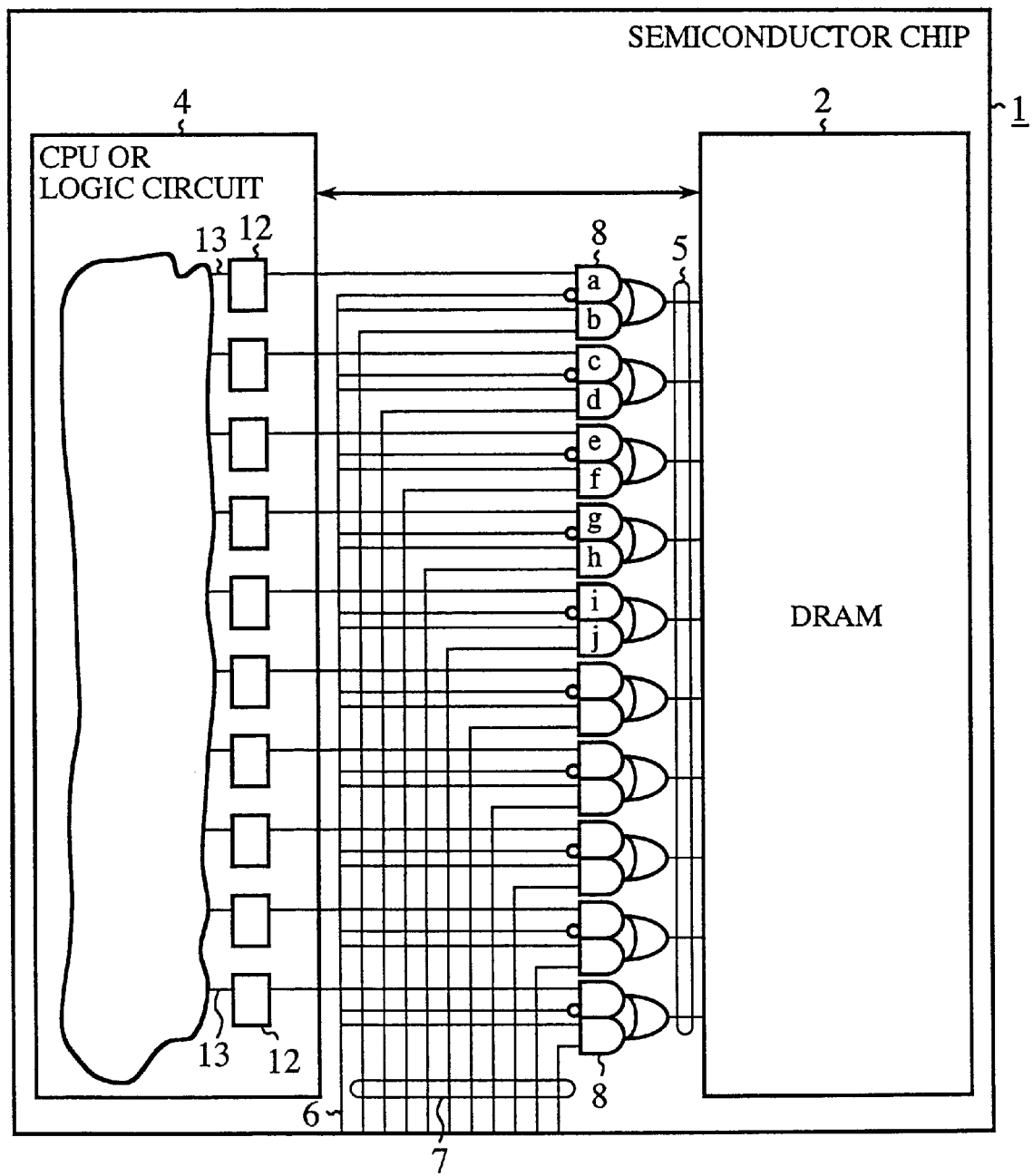
FIG. 8 is a block diagram to compare the configuration of the semiconductor integrated circuit device as the first embodiment shown in FIG. 1 with the configuration of the semiconductor integrated circuit device as the third embodiment shown in FIG. 7.

FIG. 8 is a rewritten block diagram to compare the configuration of the semiconductor integrated circuit device as the first embodiment shown in FIG. 1 with the configuration of the semiconductor integrated circuit device as the third embodiment shown in FIG. 7. The selectors incorporated in the CPU or the logic circuit 4 are omitted here from FIG. 8.

As shown in FIG. 8, the selectors 11 are formed on the lines in the wiring group 5 when the test pattern data items are transferred from the flip flops 12 in the CPU or the logic circuit 4 to the DRAM 2 according to the clock signal. This configuration causes drawbacks to generate signal delay and noise and to increase the power consumption.

On the other hand, in the configuration in which the selectors 11 are formed in the CPU or the logic circuit 41, as shown in FIGS. 6 and 7, because only the lines in the wiring group 5 are formed between the CPU or the LOGIC circuit 41 and the DRAM 2 when the test pattern data items are transferred from the flip flops 12 to the DRAM 2, it is possible to avoid the generation of the signal delay and the noise and to reduce the power consumption.

As described above, according to the semiconductor integrated circuit device of the third embodiment, it is possible to have the effect to eliminate the signal delay and to avoid the generation of noise between the CPU or the logic circuit 41 and the DRAM 2, and to reduce the power consumption of the semiconductor integrated circuit device in addition to the effect of the first embodiment. Furthermore, because the selectors 11 are formed in the CPU or the logic circuit 41 by using the optimum design, it is possible to eliminate circuit elements in the logic circuit, to use commonly circuit elements, or to combine the circuit elements, so that the arrangement area for the circuit elements in the semiconductor integrated circuit device may be reduced.

Fourth Embodiment

Figure 9:
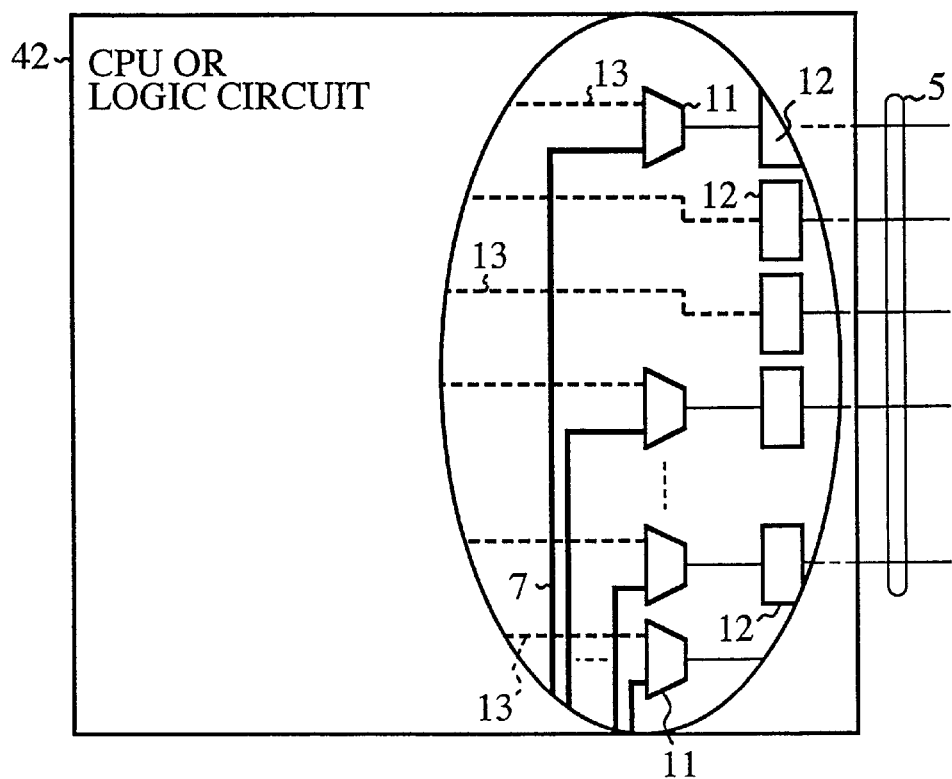
FIG. 9 is a block diagram showing a configuration of a semiconductor integrated circuit device of a hybrid type in which a CPU or a logic circuit and a DRAM are mounted on a same semiconductor chip as the fourth embodiment according to the present invention.

FIG. 9 is a block diagram showing a configuration of the semiconductor integrated circuit device of a hybrid type in which the CPU or the logic circuit and the DRAM are mounted on the same semiconductor chip as the fourth embodiment according to the present invention. In the configuration shown in FIG. 9, several selectors 11 are eliminated from the configuration of the semiconductor integrated circuit device shown in FIG. 8. That is, so long as a signal value to be transferred to the eliminated selector may be predicted in advance through the lines in the wiring group 13, the selector may be eliminated from the configuration shown in FIG. 8.

Figure 10:
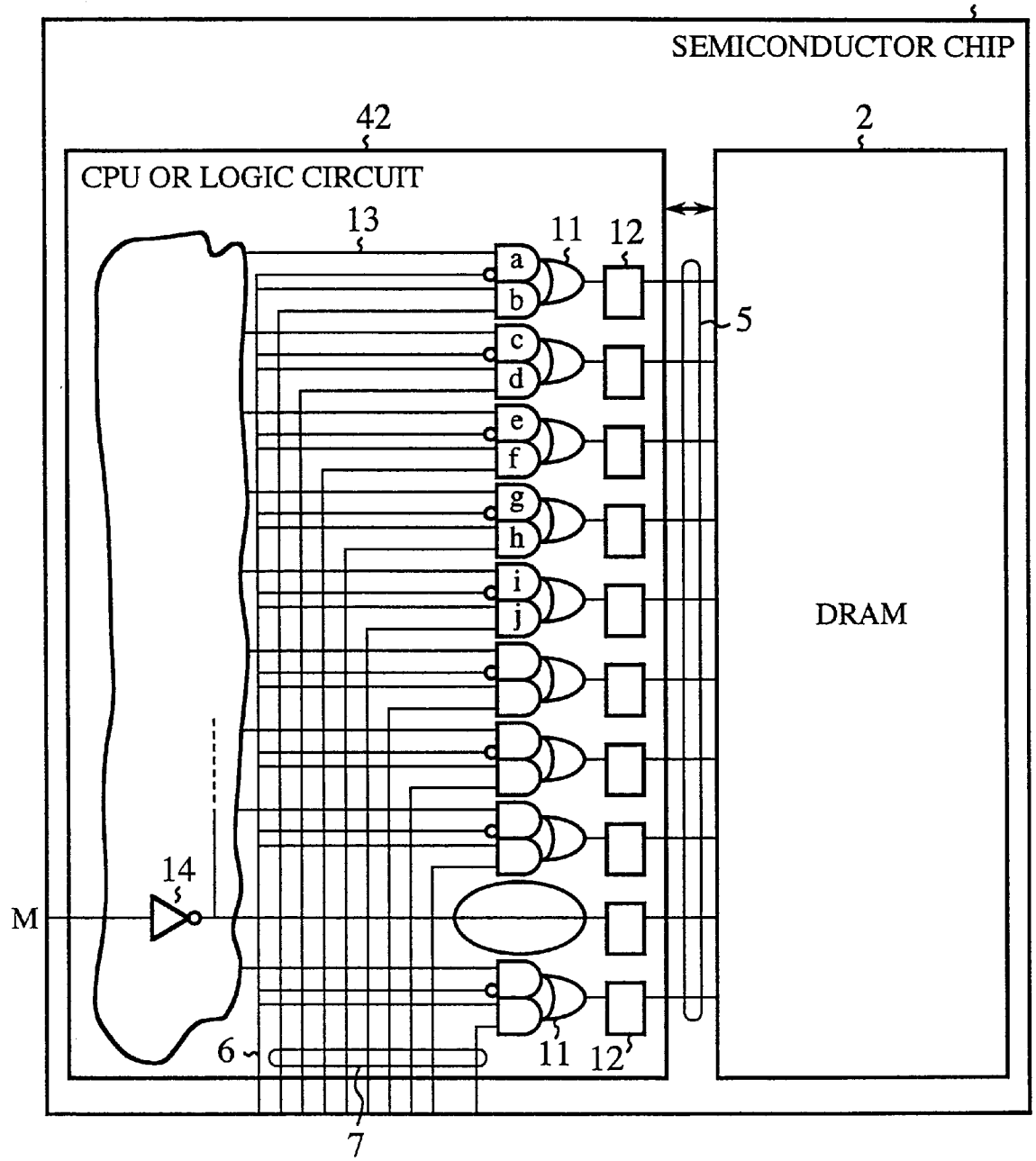
FIG. 10 is a block diagram showing a detailed configuration of the semiconductor integrated circuit device shown in FIG. 9.

FIG. 10 is a block diagram showing a detailed configuration of the semiconductor integrated circuit device shown in FIG. 9. In FIG. 10, the reference number 14 designates an inverter, and 42 denotes the CPU or the logic circuit. Because other components in the semiconductor integrated circuit as the fourth embodiment are the same as those in the semiconductor integrated circuit device as the third embodiment, the same reference numbers are used, and therefore the explanation of them is omitted here for brevity.

Next, a description will be given of the operation of the semiconductor integrated circuit device of the fourth embodiment.

Because both configurations, as shown in FIGS. 9 and 10, show the same function of the semiconductor integrated circuit device of the fourth embodiment, hereinafter the operation of the configuration shown in FIG. 10 will be mainly explained.

Although the selectors 11 are formed corresponding to all circuits such as all of the flip flops 12 in the semiconductor integrated circuit device of the third embodiment shown in FIG. 7, it is possible to eliminate the selector 11 if a data items is transferred from an external terminal M to the flip flop 12 through the inverter 14, as shown in FIG. 10, for example. In this case, the data item transferred from the external device (omitted from FIG. 10) to the flip flop 12 through the external terminal M may be used as the test pattern, so that the selector 11 may be eliminated.

As described above, according to the semiconductor integrated circuit device of the fourth embodiment, it is possible to obtain the effect in which the selectors 11 may be eliminated in addition to the effect of the first embodiment, so that the arrangement area on the semiconductor chip 1 may be used efficiently.

Fifth Embodiment

Figure 11:
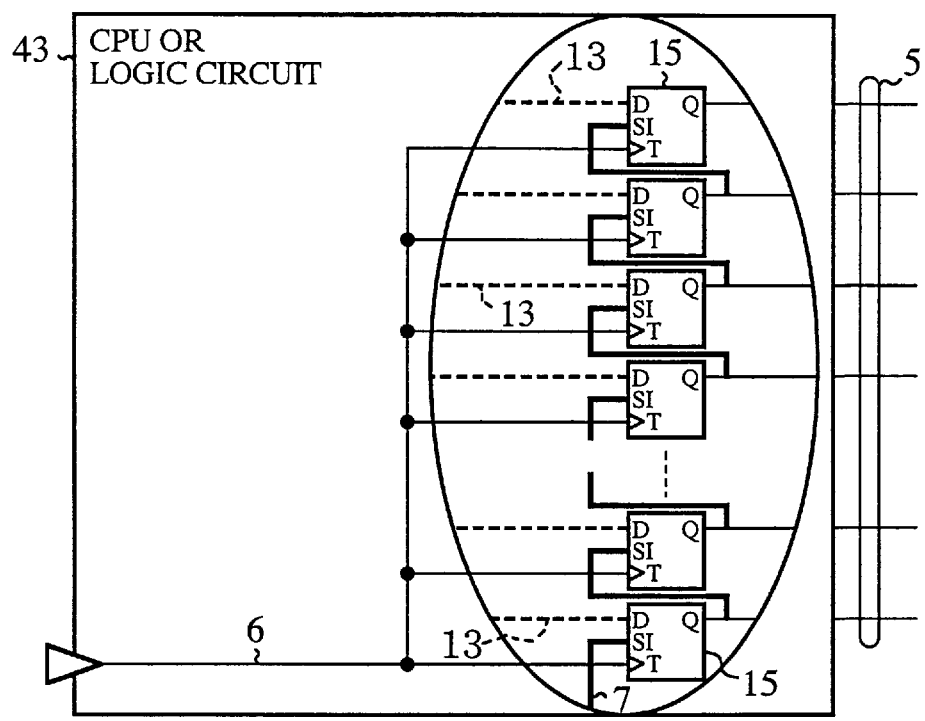
FIG. 11 is a block diagram mainly showing a configuration of a CPU or a logic circuit in a semiconductor integrated circuit device of a hybrid type in which the CPU or the logic circuit and a DRAM are mounted on a same semiconductor chip as the fifth embodiment according to the present invention.

FIG. 11 is a block diagram mainly showing a configuration of the CPU or the logic circuit in the semiconductor integrated circuit device of a hybrid type in which the CPU or the logic circuit and the DRAM are mounted on the same semiconductor chip as the fifth embodiment according to the present invention. In FIG. 11, the reference number 43 designates the CPU or the logic circuit, and 15 denotes scan flip flops (as scan pass circuits) that are formed in an optimum design in the CPU or the logic circuit 43. The scan flip flops 12 disconnect the wiring group 13, that is used for the normal operation, not used for the test operation, from the wiring group 5 and connect the wiring 7 to the wiring group 5 according to the control signal, and convert serial test patterns provided through the wiring 7 to parallel test patterns, and then provide the converted parallel test patterns to the wiring 5.

Next, a description will be given of the operation of the semiconductor integrated circuit device of the fifth embodiment.

When the test patterns are transferred to the scan flip flop 15 at the upper most position in FIG. 11, according to a following clock signal, the scan flip flops 15 transfer the converted parallel test patterns to the DRAM 2 through the wiring 5, and then the parallel test patterns are written into the DRAM 2.

In the explanation of the semiconductor integrated circuit device of the fifth embodiment described above, only the data transfer of the converted parallel test patterns from the scan flip flops 15 incorporated in the CPU or the logic circuit to the DRAM 2 has been shown. After this process, it is possible to read the parallel test patterns written in the DRAM 2 as the test result by the scan flip flops 15 and then to convert the parallel test patterns to serial test patterns by the scan flip flop 15 and to transfer the serial test patterns to the external device (not shown) through the wiring 7.

As described above, according to the semiconductor integrated circuit device of the fifth embodiment, it is possible to decrease the number of the wiring group 7, like the case of the semiconductor integrated circuit device of the second embodiment. In addition to this effect, like the case of the semiconductor integrated circuit device of the third embodiment, it is possible to eliminate the generation of signal transmission delay and noise, and to reduce the power consumption, and further to reduce the arrangement area on the semiconductor chip 1 under the optimum design.

Sixth Embodiment

Figure 12:
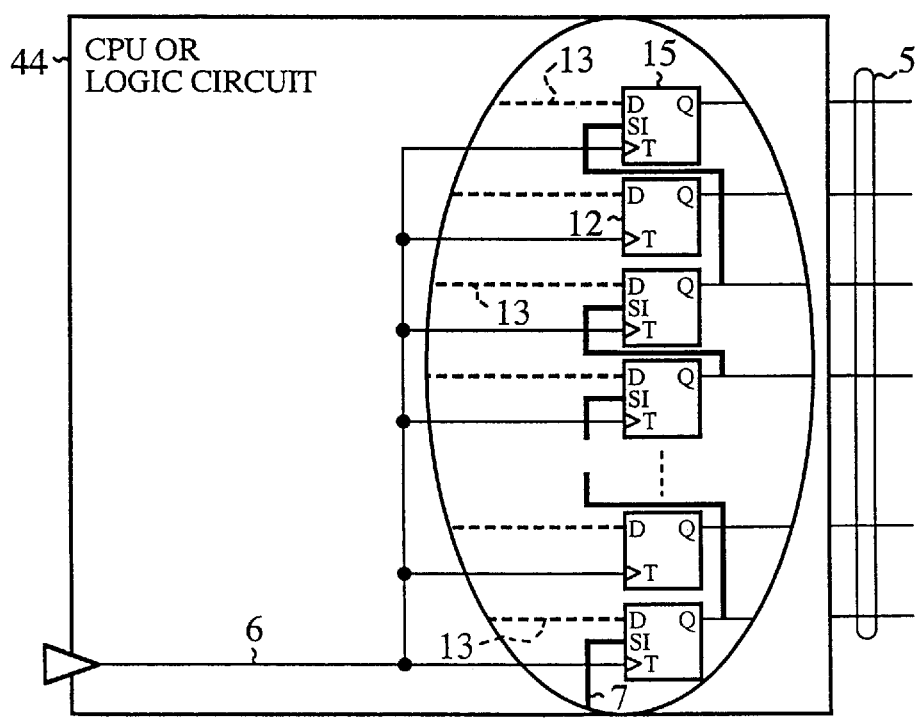
FIG. 12 is a block diagram mainly showing a configuration of a CPU or a logic circuit in a semiconductor integrated circuit device of a hybrid type in which the CPU or the logic circuit and a DRAM are mounted on a same semiconductor chip as the sixth embodiment according to the present invention.

FIG. 12 is a block diagram mainly showing a configuration of the CPU or the logic circuit in the semiconductor integrated circuit device of a hybrid type in which the CPU or the logic circuit and the DRAM are mounted on the same semiconductor chip as the sixth embodiment according to the present invention. In the configuration shown FIG. 12, the scan flip flops 15 that are formed in the configuration shown in FIG. 11 are replaced with flip flops 12. That is, so long as test patterns transferred to the scan flip flops 15 through the wiring 13 may be predicted in advance, those scan flip flops 15 may be replaced with the flip flops 12. The reference number 44 designates the CPU or the logic circuit in which two scan flip flops 15 are replaced with the flip flops 12. Because other components in the semiconductor integrated circuit as the sixth embodiment are the same as those in the semiconductor integrated circuit device as the fifth embodiment, the same reference numbers are used, and therefore the explanation of them is omitted here for brevity.

Next, a description will be given of the operation of the semiconductor integrated circuit device of the sixth embodiment.

In the semiconductor integrated circuit device of the fifth embodiment shown in FIG. 11, the scan flip flops are formed corresponding to all circuits such as all lines in the wiring group 5. As has been explained in the fourth embodiment, so long as a test pattern data item to be transferred form the CPU or the logic circuit 44 to the DRAM 2 may be predicted in advance, the scan flip flop 15 corresponding to the line through which this test pattern data item is transferred may be replaced with the flip flop 12. In this case, this test pattern data item is transferred directly to the DRAM without scanning it by the scan flip flop 15.

As described above, according to the semiconductor integrated circuit device of the sixth embodiment, because the scan flip flops 15 may be replaced with the flip flops 12, it is possible to reduce the area on the semiconductor chip 1 in addition to the effect of the semiconductor integrated circuit device of the fifth embodiment. This causes to use the circuit arrangement area on the semiconductor chip 1 efficiently.

Seventh Embodiment

Figure 13:
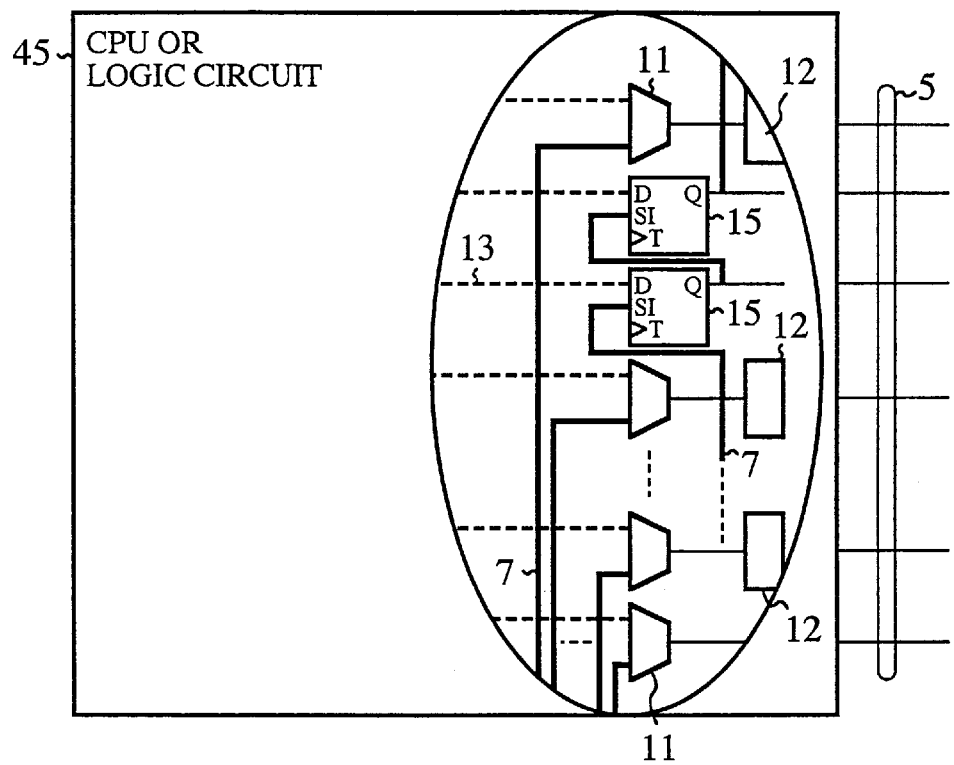
FIG. 13 is a block diagram mainly showing a configuration of a CPU or a logic circuit in a semiconductor integrated circuit device of a hybrid type in which the CPU or the logic circuit and a DRAM are mounted on a same semiconductor chip as the seventh embodiment according to the present invention.

FIG. 13 is a block diagram mainly showing a configuration of the CPU or the logic circuit in the semiconductor integrated circuit device of a hybrid type in which the CPU or the logic circuit and the DRAM are mounted on the same semiconductor chip as the seventh embodiment according to the present invention. In FIG. 13, the reference number 45 designates the CPU or the logic circuit. In the configuration of the semiconductor integrated circuit device of the seventh embodiment, the circuit comprising the selector 11 and the flip flop 12, and the scan flip flop 15 are combined.

As described above, according to the semiconductor integrated circuit device of the seventh embodiment, it is possible to increase the selectivity of the combination of the circuit comprising the selector 11 and the flip flop 12 and the scan flip flop 12 in an optimum design in addition to the effect of the semiconductor integrated circuit of the fifth embodiment.

Eighth Embodiment

Figure 14:
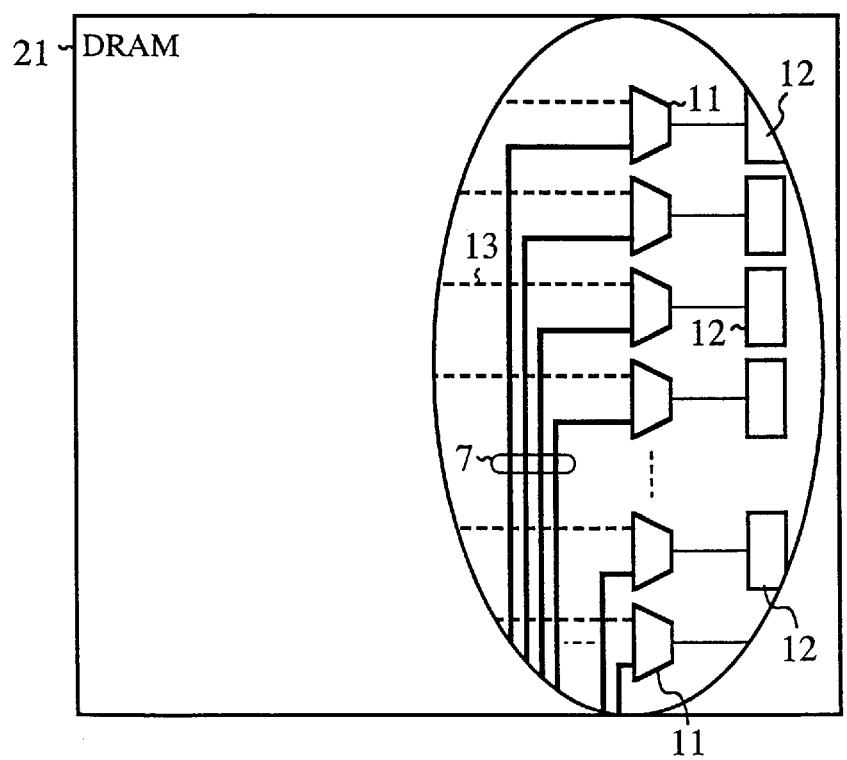
FIG. 14 is a block diagram mainly showing a configuration of a DRAM having selectors, like the configuration of the third embodiment, in a semiconductor integrated circuit device of a hybrid type in which a CPU or a logic circuit and the DRAM are mounted on a same semiconductor chip as the eighth embodiment according to the present invention.

FIG. 14 is a block diagram mainly showing a configuration of the DRAM having selectors, like the configuration of the third embodiment, in the semiconductor integrated circuit device of a hybrid type in which the CPU or the logic circuit and the DRAM are mounted on a same semiconductor chip as the eighth embodiment according to the present invention. In FIG. 14, the reference number 21 designates the DRAM. In the semiconductor integrated circuit of the eighth embodiment, selectors 11 are formed in the DRAM 21 in addition to the configuration of the semiconductor integrated circuit device of the third embodiment in which the selectors are formed in the CPU or the logic circuit shown in FIG. 6.

Because the configuration of the selectors 11 and the flip flops 12 in the DRAM 21 is the same as the configuration of the CPU or the logic circuit 41 of the third embodiment, the explanation is therefore omitted here for brevity.

Thus, because the selector 11 and the flip flop 12 are formed on the DRAM 2 corresponding to the wiring group 13 and the wiring group 7 in the semiconductor integrated circuit device of the eighth embodiment, it is possible to test the operation of the CPU or the logic circuit in addition to the effect of the semiconductor integrated circuit of the third embodiment in which the DRAM 2 may be tested.

Ninth Embodiment

Figure 15:
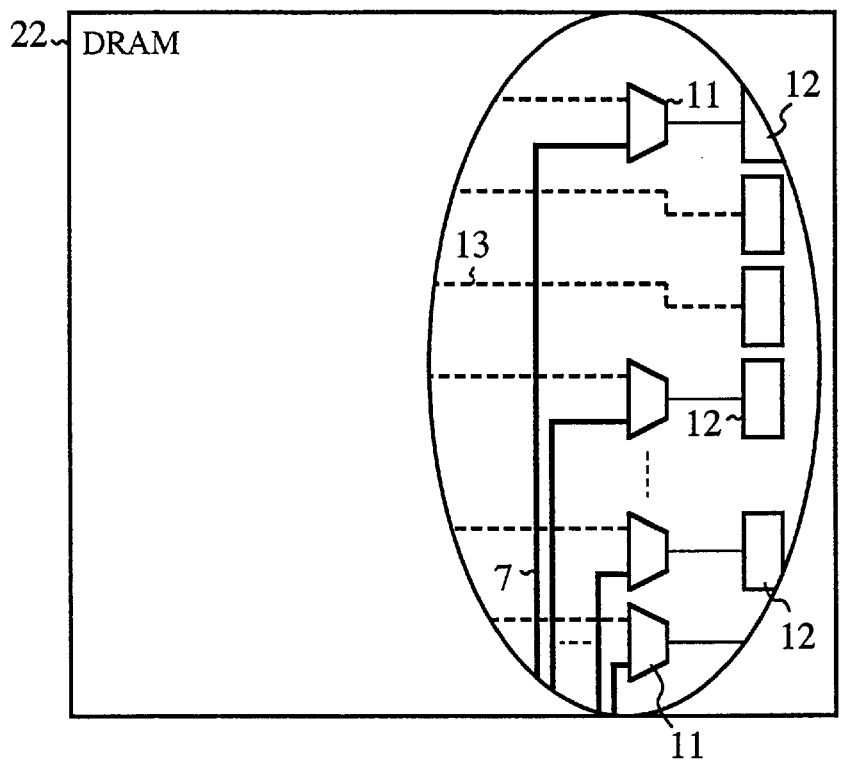
FIG. 15 is a block diagram mainly showing a DRAM having a configuration in which one part of selectors are eliminated, like the configuration of the fourth embodiment, in a semiconductor integrated circuit device of a hybrid type in which a CPU or a logic circuit and the DRAM are mounted on a same semiconductor chip as the ninth embodiment according to the present invention.

FIG. 15 is a block diagram mainly showing the DRAM having the configuration in which one part of selectors are eliminated, like the configuration of the fourth embodiment, in the semiconductor integrated circuit device of a hybrid type in which the CPU or the logic circuit and the DRAM are mounted on the same semiconductor chip as the ninth embodiment according to the present invention. In FIG. 15, the reference number 22 designates the DRAM.

In the semiconductor integrated circuit device of the ninth embodiment, the DRAM 22 incorporates the selectors 11. In the DRAM 22, several selectors are eliminated, like the configuration of the CPU or the logic circuit 42 in the semiconductor integrated circuit of the fourth embodiment. The reason to eliminate the selectors is the same as the fourth embodiment. Because the configuration of the selectors 11 in the DRAM 22 is the same as the configuration of the CPU or the logic circuit 42 of the fourth embodiment, the explanation is therefore omitted here for brevity.

Thus, according to the semiconductor integrated circuit of the ninth embodiment, because the selectors having the configuration in which several selectors are eliminated and the flip flops 12 are formed in the DRAM 22, it is possible to execute the test operation of the CPU or the logic circuit in addition to the effect of the semiconductor integrated circuit of the fourth embodiment.

Tenth Embodiment

Figure 16:
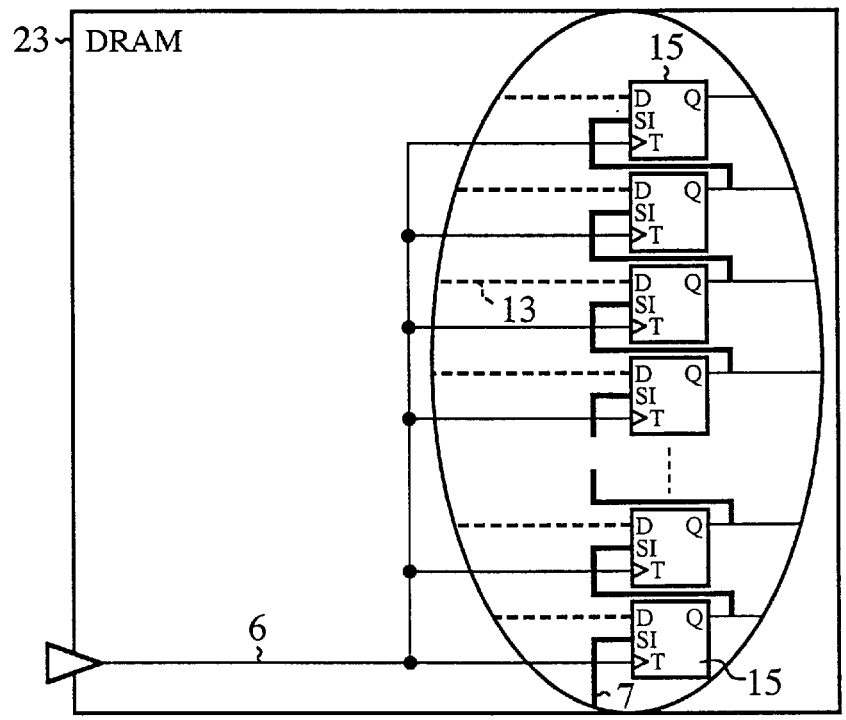
FIG. 16 is a block diagram mainly showing a configuration of a DRAM having scan flip flops, like the configuration of the fifth embodiment, in a semiconductor integrated circuit device of a hybrid type in which a CPU or a logic circuit and the DRAM are mounted on a same semiconductor or chip as the tenth embodiment according to the present invention.

FIG. 16 is a block diagram mainly showing the configuration of the DRAM having scan flip flops, like the configuration of the fifth embodiment, in the semiconductor integrated circuit device of a hybrid type in which the CPU or the logic circuit and the DRAM are mounted on the same semiconductor chip as the tenth embodiment according to the present invention. In FIG. 15, the reference number 23 designates the DRAM.

In the semiconductor integrated circuit device, the scan flip flops 15 are formed in the DRAM 23 in addition to the configuration of the CPU or the logic circuit 43 in the semiconductor integrated circuit device of the fifth embodiment shown in FIG. 11. Because the configuration of the scan flip flops 15 in the DRAM 23 is the same as the configuration of the CPU or the logic circuit 43 of the seventh embodiment, the explanation is therefore omitted here for brevity.

Thus, according to the semiconductor integrated circuit of the tenth embodiment, because the scan flip flop are formed in the DRAM 23, it is possible to execute the test operation of the CPU or the logic circuit in addition to the effect of the semiconductor integrated circuit of the fifth embodiment.

Eleventh Embodiment

Figure 17:
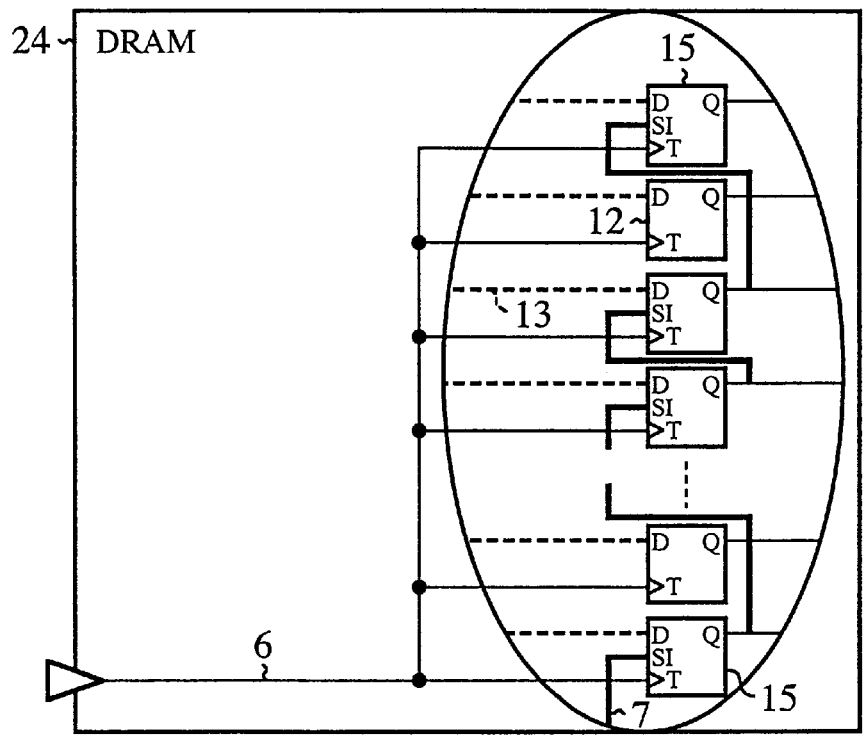
FIG. 17 is a block diagram mainly showing a configuration of a DRAM having scan flip flops and flip flops, like the configuration of the sixth embodiment, in a semiconductor integrated circuit device of a hybrid type in which a CPU or a logic circuit and the DRAM are mounted on a same semiconductor chip as the eleventh embodiment according to the present invention.

FIG. 17 is a block diagram mainly showing the configuration of the DRAM in which scan flip flops and flip flops are incorporated, like the configuration of the sixth embodiment, in the semiconductor integrated circuit device of a hybrid type in which the CPU or the logic circuit and the DRAM are mounted on the same semiconductor chip as the eleventh embodiment according to the present invention. In FIG. 17, the reference number 24 designates the DRAM.

In the semiconductor integrated circuit device, the scan flip flops 15 and the flip flops 12 are formed in the DRAM 23 in addition to the configuration of the CPU or the logic circuit 44 in the semiconductor integrated circuit device of the sixth embodiment shown in FIG. 12. Because the configuration of the scan flip flops 15 and the flip flops 12 in the DRAM 24 is the same as the configuration of the CPU or the logic circuit 44 of the sixth embodiment, the explanation is therefore omitted here for brevity.

Thus, according to the semiconductor integrated circuit of the eleventh embodiment, because the scan flip flops 15 and the flip flops 12 are formed in the DRAM 24, it is possible to execute the test operation of the CPU or the logic circuit in addition to the effect of the semiconductor integrated circuit of the sixth embodiment.

Twelfth Embodiment

Figure 18:
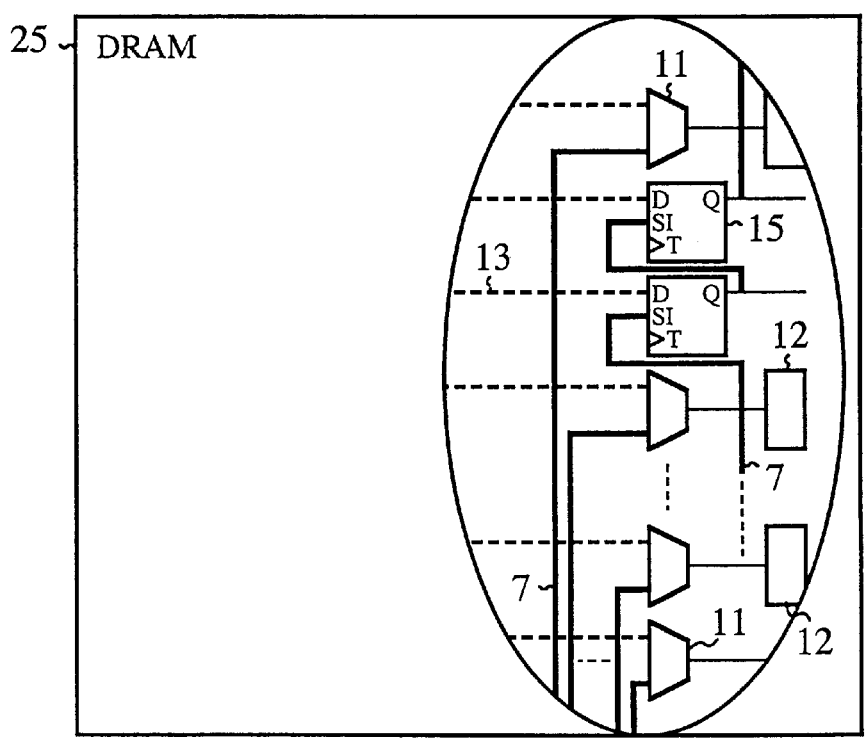
FIG. 18 is a block diagram mainly showing a configuration of a DRAM having selectors and scan flip flops, like the configuration of the seventh embodiment, in a semiconductor integrated circuit device of a hybrid type in which a CPU or a logic circuit and the DRAM are mounted on a same semiconductor chip as the twelfth embodiment according to the present invention.

FIG. 18 is a block diagram mainly showing the configuration of the DRAM having selectors and scan flip flops, like the configuration of the seventh embodiment, in the semiconductor integrated circuit device of a hybrid type in which the CPU or the logic circuit and the DRAM are mounted on the same semiconductor chip as the twelfth embodiment according to the present invention. In FIG. 18, the reference number 25 designates the DRAM.

In the semiconductor integrated circuit device, the selectors 11 and the scan flip flops 15 are formed in the DRAM 25 in addition to the configuration of the CPU or the logic circuit 45 in the semiconductor integrated circuit device of the seventh embodiment shown in FIG. 12. Because the configuration of the selectors 11 and the scan flip flops 15 in the DRAM 25 is the same as the configuration of the CPU or the logic circuit 45 of the seventh embodiment, the explanation is therefore omitted here for brevity.

Thus, according to the semiconductor integrated circuit of the twelfth embodiment, because the selectors 11 and the scan flip flops 15 are formed in the DRAM 25, it is possible to execute the test operation of the CPU or the logic circuit in addition to the effect of the semiconductor integrated circuit of the sixth embodiment.

Thirteenth Embodiment

Figure 19:
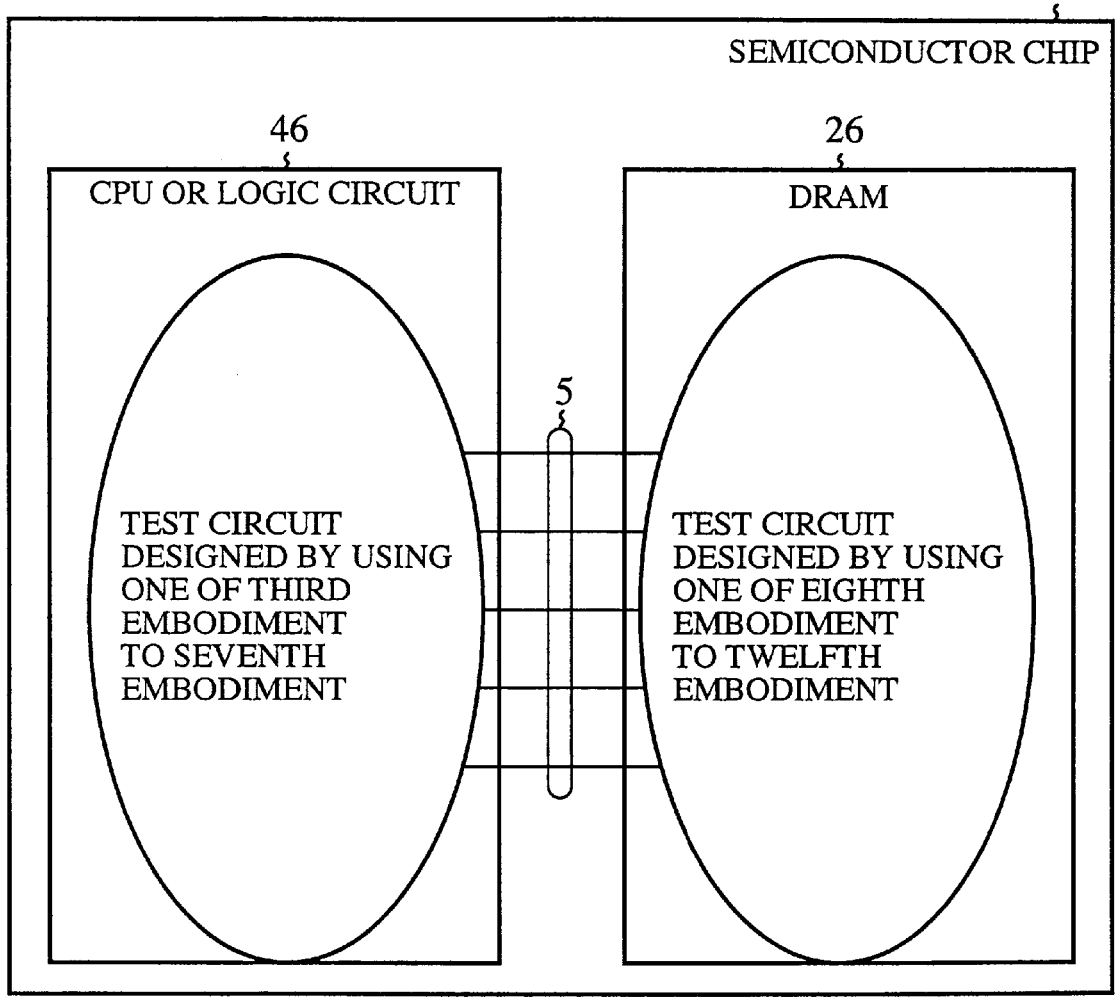
FIG. 19 is a block diagram showing a configuration of a semiconductor integrated circuit device of a hybrid type in which a CPU or a logic circuit and a DRAM are mounted on a same semiconductor chip as the thirteenth embodiment according to the present invention.

FIG. 19 is a block diagram showing a configuration of a semiconductor integrated circuit device of a hybrid type in which a CPU or a logic circuit and a DRAM are mounted on a same semiconductor chip as the thirteenth embodiment according to the present invention. In FIG. 19, the reference number 46 designates a CPU or a logic circuit and the reference number 26 denotes a DRAM.

In the configuration of the semiconductor integrated circuit device of the thirteenth embodiment, one of the configuration of the CPU or the logic circuits of the third embodiment to the seventh embodiment shown in FIGS. 6 to 13 is used as the CPU or the logic circuit 46, and one of the DRAMs of the eighth embodiment to the twelfth embodiment shown in FIGS. 14 to 18 is used as the DRAM 26. Thus, to combine the CPU or the logic circuit 46 and the DRAM 26 by using the various embodiments of the present invention allows to perform an optimum design of the semiconductor integrated circuit device, and also allows to increase the selectivity of the combinations of the CPU or the logic circuit and the DRAM as the various embodiments during the optimum design.

Figure 20:
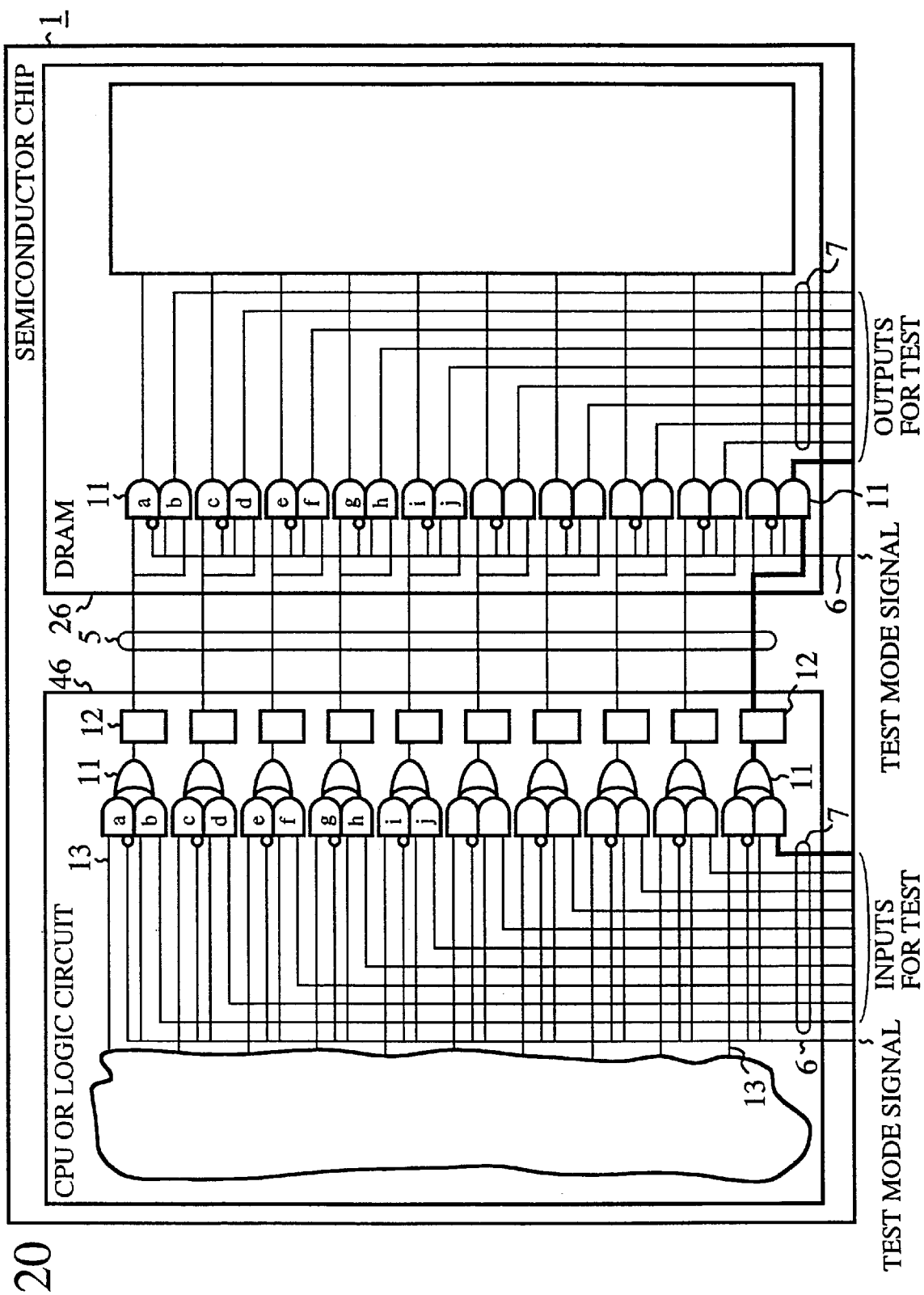
FIG. 20 is a block diagram showing one example of the semiconductor integrated circuit device shown in FIG. 19.
Figure 21:
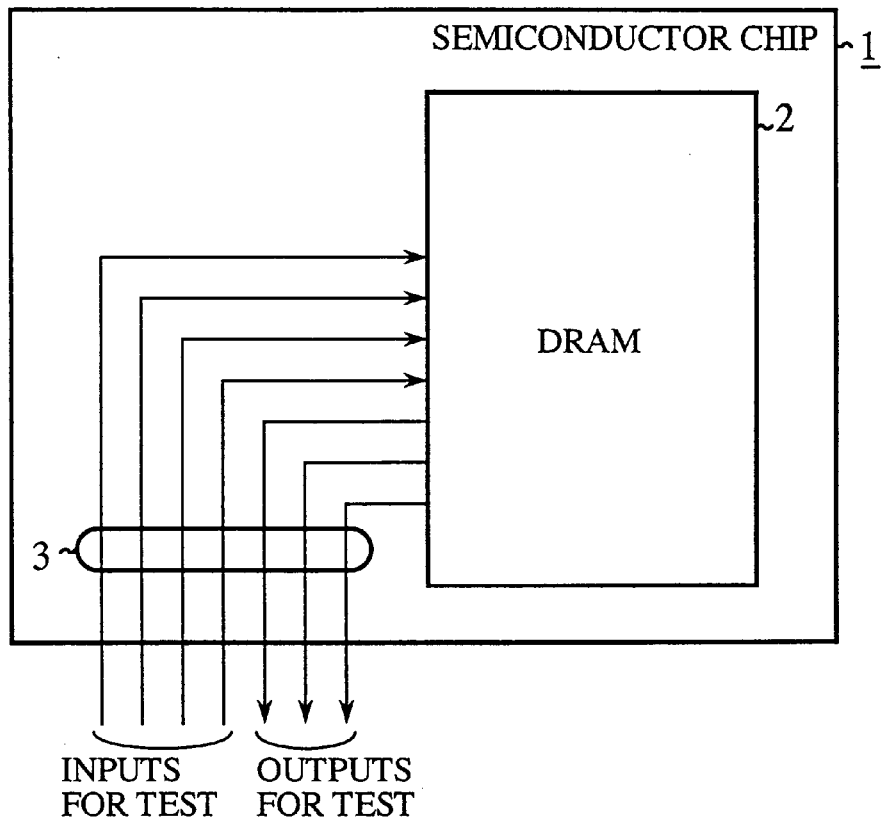
FIG. 21 is a block diagram showing a configuration of a conventional semiconductor integrated circuit device having a DRAM.

FIG. 20 is a block diagram showing one example of the semiconductor integrated circuit device shown in FIG. 19. This configuration shown in FIG. 20 may be used for performing the connection test between the CPU or the logic circuit 46 and the DRAM 26. First, both the test mode signals for the CPU or the logic circuit 46 and the DRAM 26 are set to the H level, so that the wiring 7, the selectors 11, the flip flops 12, and the wiring 5 are connected in the CPU or the logic circuit 46, and the selectors 11 and the wiring 7 are connected in the DRAM 26. Thereby, as shown by the solid line in FIG. 20, test pattern data items are received from an external device (not shown) to the CPU or the logic circuit 46 through the line in the wiring group 7, then transferred to the DRAM 26 through the line in the wiring group 5, and output through the DRAM 26 to an external device (not shown). This connection test operation between the CPU or the logic circuit 46 and the DRAM 26 is performed for all lines in the wiring group 5.

As described above, according to the semiconductor integrated circuit device of the thirteenth embodiment, it is possible to obtain the effects of the third embodiment to the twelfth embodiment. In addition to these effects, it is also possible to increase the selectivity of the configuration of the semiconductor integrated circuit device in the optimum design by combining various embodiments of the CPU or the logic circuit and the DRAM. Furthermore, it is possible to perform the connection test between the CPU or the logic circuit and the DRAM.

As set forth above, according to the semiconductor integrated circuit device in which the CPU or the logic circuit and the DRAM are mounted on the same semiconductor chip according to the present invention, because test pattern data items may be transferred directly to the DRAM by switching the switch circuits such as the selectors, it is possible to perform the test of the DRAM.

In addition, according to the semiconductor integrated circuit device in which the CPU or the logic circuit and the DRAM are mounted on the same semiconductor chip according to the present invention, because the scan pass circuit converts received serial test pattern data items to the parallel test pattern data items, it is possible to decrease the number of the lines in the third wiring group.

In addition, according to the semiconductor integrated circuit device in which the CPU or the logic circuit and the DRAM are mounted on the same semiconductor chip according to the present invention, because the switch circuits are formed in the DRAM and the CPU or the logic circuit, it is not required to form the switch circuits on the wiring connecting both the CPU or the logic circuit and the DRAM. This configuration causes to eliminate the generation of signal transmission delay between the CPU or the logic circuit and the DRAM, to eliminate the generation of noise, and to reduce the power consumption. In addition, because it is possible to eliminate the circuit components, to use the circuit components commonly, and to combine the circuit components efficiently when the switch circuits are formed in the optimum design, it is thereby possible to reduce the arrangement area on the semiconductor chip.

In addition, according to the semiconductor integrated circuit device in which the CPU or the logic circuit and the DRAM are mounted on the same semiconductor chip according to the present invention, because it is possible to eliminate the switch circuit formed on a line so long as a data item to be transferred through this line may be predicted in advance, the arrangement area on the semiconductor chip may be used efficiently.

Furthermore, according to the semiconductor integrated circuit device in which the CPU or the logic circuit and the DRAM are mounted on the same semiconductor chip according to the present invention, because the scan pass circuits may perform the data conversion operation for the test pattern data items from the serial form to the parallel form or from the parallel form to the serial form, it is possible to decrease the number of the lines in the third wiring group. Furthermore, because the switch circuits are formed in the DRAM and the CPU or the logic circuit, it is not required to form the switch circuits on the wiring connecting both the CPU or the logic circuit and the DRAM.

This configuration causes to eliminate the generation of signal transmission delay cause between the CPU or the logic circuit and the DRAM, to eliminate the generation of noise, and to reduce the power consumption. In addition, because it is possible to eliminate the circuit components, to use the circuit components commonly, and to combine the circuit components efficiently when the scan pass circuits are formed in the optimum design, it is thereby possible to reduce the arrangement area on the semiconductor chip.

In addition, according to the semiconductor integrated circuit device in which the CPU or the logic circuit and the DRAM are mounted on the same semiconductor chip according to the present invention, because the flip flops are used instead of the scan pass circuits, it is possible to use the arrangement area on the semiconductor chip efficiently.

Furthermore, according to the semiconductor integrated circuit device in which the CPU or the logic circuit and the DRAM are mounted on the same semiconductor chip according to the present invention, because the switch circuits and the scan pass circuits may be used selectively in the optimum design, it is possible to increase the selectivity in the optimum design.

Moreover, according to the semiconductor integrated circuit device in which the CPU or the logic circuit and the DRAM are mounted on the same semiconductor chip according to the present invention, because various embodiments of the CPU or the logic circuit and the DRAM may be combined, it is possible to increase the selectivity in the optimum design. In addition, it is also possible to perform the connection test between the CPU or the logic circuit and the DRAM.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A semiconductor integrated circuit device comprising:
   a central processing unit (CPU) or a logic circuit formed on a semiconductor chip;
   a dynamic random access memory (DRAM) mounted on said same semiconductor chip;
   a first wiring having a plurality of lines through which said CPU or said logic circuit is electrically connected to said DRAM;
   a second wiring through which a control signal is inputted;
   a third wiring having one or more lines through which test pattern data items are inputted and output; and
   a plurality of switch circuits for switching a connection between said CPU or said logic circuit through said first wiring to/from a connection between said DRAM and said third wiring through said first wiring according to said control signal received through said second wiring.

2. The semiconductor integrated circuit device as claimed in claim 1, further comprising scan pass circuits formed on said plurality of lines in said first wiring for converting serial test pattern data items transferred through said third wiring to parallel test pattern data items, for outputting said converted parallel test pattern data items to said DRAM through said first wiring, further for converting parallel test pattern data items as test result transferred from said DRAM through said first wiring to serial test pattern data items, and for outputting said serial test pattern data items as the test result to said third wiring.

3. A semiconductor integrated circuit device comprising:
   a central processing unit (CPU) or a logic circuit formed on a semiconductor chip;
   a dynamic random access memory (DRAM) mounted on said same semiconductor chip;
   a first wiring having a plurality of lines through which said CPU or said logic circuit is electrically connected to said DRAM;
   a second wiring through which a control signal is inputted;
   a third wiring having one or more lines through which test pattern data items are inputted and output; and
   a plurality of switch circuits, formed in at least one of said CPU or said logic circuit and said DRAM, for switching a connection between a fourth wiring having one or more lines that are used during a normal operation other than a test operation and said first wiring to/from a connection between said third wiring and said first wiring according to said control signal received through said second wiring.

4. The semiconductor integrated circuit device as claimed in claim 3, wherein when a test pattern data item to be transferred through said fourth wiring to said first wiring may be predicted in advance, said fourth wiring is electrically connected to said corresponding line in said first wiring directly.

5. The semiconductor integrated circuit device as claimed in claim 4, wherein said plurality of switch circuits or a plurality of scan pass circuits output test pattern data items as said test result from said DRAM connected to said fist wiring after said CPU or said logic circuit outputs said test pattern data items to said first wiring, and said plurality of switch circuits or said plurality of scan pass circuits output said test pattern data items as a test result from said CPU or said logic circuit when said test pattern data items are output from said DRAM to said first wiring.

6. A semiconductor integrated circuit device as claimed in claim 3, further comprises a plurality of scan pass circuits formed in said CPU or said logic circuit and said DRAM in which said plurality of switch circuits are formed, for halting a connection between said fourth wiring and said first wiring on which no switch circuit is formed, for converting serial test pattern data items inputted through said third wiring to parallel test pattern data items, for outputting said converted parallel test pattern data items to said first wiring, further for converting parallel test pattern data items as a test result transferred from said DRAM through said first wiring to serial test pattern data items, and for outputting said serial test pattern data items that have been converted as the test result to said third wiring, according to said control signal received through said second wiring.

7. The semiconductor integrated circuit device as claimed in claim 6, wherein said plurality of switch circuits or said plurality of scan pass circuits output test pattern data items as said test result from said DRAM connected to said fist wiring after said CPU or said logic circuit outputs said test pattern data items to said first wiring, and said plurality of switch circuits or said plurality of scan pass circuits output said test pattern data items as a test result from said CPU or said logic circuit when said test pattern data items are output from said DRAM to said first wiring.

8. The semiconductor integrated circuit device as claimed in claim 3, wherein said plurality of switch circuits or a plurality of scan pass circuits output test pattern data items as said test result from said DRAM connected to said fist wiring after said CPU or said logic circuit outputs said test pattern data items to said first wiring, and said plurality of switch circuits or said plurality of scan pass circuits output said test pattern data items as a test result from said CPU or said logic circuit when said test pattern data items are output from said DRAM to said first wiring.

9. A semiconductor integrated circuit device comprising:

a central processing unit (CPU) or a logic circuit formed on a semiconductor chip;

a dynamic random access memory (DRAM) mounted on said same semiconductor chip;

a first wiring having a plurality of lines through which said CPU or said logic circuit is electrically connected to said DRAM;

a second wiring through which a control signal is inputted;

a third wiring having one or more lines through which test pattern data items are inputted and output; and scan pass circuits, formed on at least one of said CPU or said logic circuit and said DRAM, for halting a connection between a fourth wiring having one or more lines that are used during a normal operation other than a test operation and said first wiring, for converting serial test pattern data items inputted through said third wiring to parallel test pattern data items, for outputting said converted parallel test pattern data items to said first wiring, further for converting parallel test pattern data items as a test result transferred from said DRAM through said first wiring to serial test pattern data items, and for outputting said serial test pattern data items that have been converted as the test result to said third wiring, according to said control signal received through said second wiring.

10. The semiconductor integrated circuit device as claimed in claim 9, wherein in said scan pass circuits, a scan flip flop is formed at a node to electrically disconnect said fourth wiring from said first wiring according to said control signal inputted through said second wiring, and a flip flop is formed at a node at which a signal value to be transferred from said line in said fourth wiring to said line in said first wiring is predicted in advance.

11. The semiconductor integrated circuit device as claimed in claim 10, wherein said plurality of switch circuits or said plurality of scan pass circuits output test pattern data items as said test result from said DRAM connected to said fist wiring after said CPU or said logic circuit outputs said test pattern data items to said first wiring, and said plurality of switch circuits or said plurality of scan pass circuits output said test pattern data items as a test result from said CPU or said logic circuit when said test pattern data items are output from said DRAM to said first wiring.

12. The semiconductor integrated circuit device as claimed in claim 9, wherein said plurality of switch circuits or said plurality of scan pass circuits output test pattern data items as said test result from said DRAM connected to said fist wiring after said CPU or said logic circuit outputs said test pattern data items to said first wiring, and said plurality of switch circuits or said plurality of scan pass circuits output said test pattern data items as a test result from said CPU or said logic circuit when said test pattern data items are output from said DRAM to said first wiring.

* * * * *